United States Patent
Singhal et al.

(10) Patent No.: US 7,065,726 B1
(45) Date of Patent: Jun. 20, 2006

(54) SYSTEM AND METHOD FOR GUIDING AND OPTIMIZING FORMAL VERIFICATION FOR A CIRCUIT DESIGN

(75) Inventors: Vigyan Singhal, Fremont, CA (US); Joseph E. Higgins, Albany, CA (US); Chung-Wah Norris Ip, Fremont, CA (US); Howard Wong-Toi, Albany, CA (US)

(73) Assignee: Jasper Design Automation, Inc., Mountain view, CA (US)

( * ) Notice: Subject to any disclaimer, the term of this patent is extended or adjusted under 35 U.S.C. 154(b) by 166 days.

(21) Appl. No.: 10/606,419

(22) Filed: Jun. 26, 2003

Related U.S. Application Data

(60) Provisional application No. 60/474,381, filed on May 30, 2003.

(51) Int. Cl.
*G06F 17/50* (2006.01)
(52) U.S. Cl. .................................. 716/5; 716/4
(58) Field of Classification Search ............. 716/4–5, 716/6; 703/22
See application file for complete search history.

(56) References Cited

U.S. PATENT DOCUMENTS

| | | | | |
|---|---|---|---|---|
| 5,483,470 | A * | 1/1996 | Alur et al. .................... | 716/6 |
| 6,099,575 | A * | 8/2000 | Hardin et al. ................ | 703/22 |
| 6,449,750 | B1 * | 9/2002 | Tsuchiya ...................... | 716/4 |
| 2003/0115562 | A1 * | 6/2003 | Martin et al. ................ | 716/5 |
| 2003/0208730 | A1 * | 11/2003 | Singhal et al. .............. | 716/4 |

OTHER PUBLICATIONS

R.E. Bryant, "Graph-Based Algorithms for Boolean Function Manipulation", IEEE Transactions on Computers, vol. C-35, No. 8, Aug. 1986.*
Dong Wang et al., "Formal Property Verification by Abstraction Refinement with Formal, Simulation and Hybrid Engines", Carnegie Mellon University, Design Automation Conference 2001.*
C. Kern et al., "Formal Verification in Harware Design: A survey", ACM Trans. on Design Automtion of Electronic Systems, vol. 4, No. 2, Apr. 1999, p. 123-193.*

* cited by examiner

*Primary Examiner*—A. M. Thompson
*Assistant Examiner*—Tuyen To
(74) *Attorney, Agent, or Firm*—Fenwick & West LLP

(57) ABSTRACT

The present invention is used for guiding formal verification of a circuit design in circuit simulation software to optimize the time required for verification of a circuit design. The invention modifies the analysis region being used for verification in order to optimize the time for verification. The invention allows for manual, semi-automatic, and automatic modification of the analysis region. The modification is done by either expanding or reducing the analysis region or by adding new rules as assumptions to the existing analysis region. The invention also uses the concept of an articulation point for modification of the analysis region. The modification of the analysis region is performed in a manner to optimize time and memory required for verification of the circuit design.

26 Claims, 16 Drawing Sheets

SYSTEM AND METHOD FOR GUIDING AND OPTIMIZING FORMAL VERIFICATION FOR A CIRCUIT DESIGN

This application claims the benefit of Provisional application Ser. No. 60/474,381, filed May 30, 2003.

RELATED APPLICATION

This application is related to U.S. patent application Ser. No. 10/389,316 filed on Mar. 14, 2003.

BACKGROUND

The present invention generally relates to the field of formal verification for circuit designs in circuit simulation software. More specifically, the present invention relates to guiding formal verification while verifying behavior of circuit designs.

Over the last few years, the complexity of integrated circuits has increased greatly. This increase in complexity has exacerbated the difficulty of verifying circuit designs. In a typical integrated circuit design process, which includes many steps, the verification step consumes approximately 70–80% of the total time and resources. As a result, for a circuit design, aspects such as time-to-market, profit margins, etc. greatly depend on the verification step. Flaws in the design that are not found during the verification step have significant economic impact in terms of increased time-to-market and reduced profit margins. Thus, to maximize profit, the technique used for verification needs to be highly efficient.

Traditionally, simulation-based techniques have been used to verify design correctness. In the early 1970s, verification and debugging techniques based on transistor circuit-level simulation were used. Circuit-level simulation evolved to logic gate level simulation in the late 1980s. Presently, Register Transfer Level (RTL)-level simulation is used to verify circuit designs. RTL is a hardware description language (HDL) used in describing registers of a digital electronic system, and the way in which data is transferred between them.

The simulation process uses RTL source code and a "Test Bench" to verify a design. The Test Bench contains a subset of all possible inputs to the circuit/logic. For an 'n' input circuit, there are $2^n$ possible inputs at any given time. For large n, e.g., for a complex design, the number of possible input sequences becomes prohibitively large. To simplify this, only a subset of all possible inputs is described in any given Test Bench.

As the complexity of designs increased with the passage of time, drawbacks associated with simulation-based techniques came into light. These simulation based techniques became less effective because of the following drawbacks: 1) the requirement of a large amount of time to verify circuit designs, 2) the employment of a huge amount of resources due and thus large costs and 3) the inability to completely and quickly verify large designs. For large and complex designs, where large combinations of inputs are possible, the simulation process is not reliable. This is due to the fact that the simulation process verifies the circuit only for a subset of inputs described in the Test Bench. Thus, circuit behavior for all possible combinations of inputs is not checked by the simulation process.

To overcome the drawbacks associated with simulation-based techniques, a new technique, called Formal Verification, was introduced. Formal verification makes use of RTL source code and constraints (also called requirements or properties) to verify circuit designs. Here, constraints refer to design constraints, i.e. specifications to be satisfied by the circuit designs. The specifications are defined in pure mathematical terms using intensive mathematical properties. In other words, formal verification methods model circuit behavior in mathematical terms and verify design constraints using exact calculations.

Formal verification methods are more exhaustive when compared to simulation methods as they utilize intensive mathematical calculations to verify circuit designs. The use of intensive mathematical calculations results in generation of all possible valid inputs for a given circuit and is akin to exhaustive simulation, i.e. testing the circuit for all possible inputs. Formal Verification methods provide the following advantages over the simulation methods—1) reduced validation time and thus less time-to-market, 2) reduced costs, and 3) high reliability and thus application in safety critical applications like air-bag deployment systems, public-transport systems, etc.

Typical formal verification methods make use of the following approaches to verify circuit designs:

Automatic test pattern generation (ATPG) is used to generate test patterns for the circuit design to be checked. The ATPG test patterns are validated against the design. Any discrepancies between the ATPG test patterns' expected value and the simulation value implies an error in the design. This error is fixed by modifying the design.

Boolean decision diagram (BDD) based symbolic model checking is the most widely used technology for formal verification. BDD is a technique for representing logic functions that is well known in the art. A description of the techniques used to create and manipulate BDDs may be found in R. E. Bryant, "Graph-Based Algorithms for Boolean Function Manipulation", IEEE Transactions on Computers, Vol. C-35, No. 8, August 1986, pp. 677–691.

The use of symbolic model checking is restricted to designs that contain a couple of hundreds of sequential cells (flops or latches). This makes it impossible to use this approach to verify large and complex real-world designs.

Apart from abovementioned approaches, there are various approaches that are used for formal verification.

One such approach is described in a paper by Dong Wang et. al. from Carnegie Mellon University, Design Automation Conference (DAC) 2001. This paper is titled "Formal Property Verification by Abstraction Refinement with Formal, Simulation and Hybrid Engines". The Formal verification technique provided in this paper is based on abstraction refinement strategy. Initially a simple abstract model of the circuit design is generated. In the abstract model, either the property of the design to be verified is proved or a counterexample is identified. The abstract model is refined incrementally and fully automatically using abstraction refinement until the underlying formal verification engine verifies or does not verify (falsifies) the design.

The abovementioned approaches suffer from one or more of the following disadvantages. In case, there is an error in the design, an excessive amount of time is spent in identifying the error in the circuit design. This is generally because when a property is not true for the design, more and more registers are added to the abstract model. Thus, excessive time is spent in the analysis. In addition, these approaches aim at fully automating the process of formal verification. In the process of automation, knowledge of the circuit designer is not utilized. Thus, these approaches take a large amount time to perform verification.

In light of the drawbacks associated with the prior art systems, there is a need for a system that reduces time for verification by utilizing the knowledge of a circuit designer. Thus, in addition to automatic verification, there is a need for a system that enables the designer to manually input information for formal verification. There is a need for a system that refines the abstract model efficiently so that chances of either verifying or falsifying circuit properties are maximized. Also, there is a need for an abstraction refinement strategy that reduces time for verification.

SUMMARY

The present invention is directed to a system and a method for guiding formal verification of a circuit design.

An object of the present invention is to provide a system and a method to guide formal verification to optimize the time required for verification of the circuit design.

Another object of the present invention is to provide a system and a method to choose a smallest possible analysis region to reduce time and memory for verification. Typically, smaller the analysis region quicker is the analysis and smaller the memory requirements.

Another object of the present invention is to provide a system and a method to guide formal verification for a circuit design by allowing manual modification of an analysis region for circuit design verification in order to maximize the chances of verifying or falsifying the circuit design.

Another object of the present invention is to provide a system and a method to provide appropriate intermediate checkpoints from which a user may draw conclusions about the presence (and the exact location) of a design error.

Another object of the present invention is to provide a system and a method to guide formal verification for a circuit design by allowing semi-automatic modification of an analysis region for circuit design verification in order to maximize the chances of verifying or falsifying the circuit design.

Another object of the present invention is to provide a system and a method to guide formal verification for a circuit design by defining new rules to verify the circuit design.

Yet another object of the present invention is to provide a system and a method that identifies articulation points and uses such points to optimize the analysis of an existing analysis region for circuit design verification.

To attain the above objectives, the first step is to select an analysis region for verifying the circuit design based on given specifications and assumptions. The circuit design is verified using the analysis region by employing a formal verification tool. If the verification result is true, the process of verification terminates. Also, the process terminates if the user identifies that there is an error in the circuit design. However, if the verification result is false, a counterexample is presented to the user. In such a case, the user modifies the analysis by either expanding the analysis region or defining new rules to partition the current analysis.

The analysis region can be expanded manually, semi-automatically or automatically, and the partition of the current analysis using the new rules can be specified manually, semi-automatically, or automatically.

In the case of manual expansion of the analysis region, the user selects a signal in the analysis region along which the analysis region to be expanded. The user has an option of using the entire "articulated fan-in" driving the selected signal or only a portion of the articulated fan-in. The articulated fan-in means that the system traverses back from the selected signal until a primary input, a storage element or an articulation point is encountered. If the signal is selected at a time cycle just after reset of the circuit design, only the reset portion of the articulated fan-in of the signal is added to the analysis region. If the signal is selected at a time cycle other than just after the reset, a portion or entire non-reset driving the signal is added to the analysis region. Further, the user has a choice of selecting only that portion of the articulated fan-in of the selected signal that is "turned on" by the values of signals in the analysis region at the specific time cycle.

In case of automatic and semi-automatic expansion, the analysis region is expanded based on a set of choices, typically determined from counterexamples extracted from the current analysis region. The choices are prioritized and weighted using a productivity algorithm. The analysis region is expanded along high-productivity choices, but not low-productivity choices. If there are no high-productivity choices, the user can manually specify expansion along low-productivity choices. Alternatively, the user can define new abstractions or assumptions to verify the circuit design.

The choices are also selected and prioritized through the use of a design knowledge database, usually constructed during verification of other requirements for the same design or a similar design.

As an alternative to expanding the analysis region, the user may define new abstraction or assumptions for the analysis region. This involves the user defining a rule based on a set of signals selected from the analysis region. The system of the present invention then aids the user in verifying this new rule. If the rule is verified for the circuit design, the rule is added as an assumption or abstraction for the existing analysis region. The circuit design is then verified using formal verification by associating the assumption or abstraction with the analysis region.

The concept of an "articulation point" is used to optimize the selection of new portions for expansion of analysis region. The fan-in of the articulation point is not included in the expanded analysis region, in case the articulation point resides inside the analysis region. This reduces the size of the expanded analysis region thus reducing the time for verification. In case the articulation point resides on the boundary of the analysis region, the articulated fan-in is added to the analysis region.

The present invention optimizes the modification of the analysis region to efficiently verify the circuit design. The optimization involves utilization of the knowledge of the circuit designer in reducing the time for verification by allowing manual or semi-automatic modification of analysis region. The knowledge of the circuit designer is also captured while expanding the analysis region using an articulation point. The designer has a good idea of what constitutes a promising articulation point, based on his/her knowledge of the design and design intent. An analysis region modified using the knowledge of a circuit designer reduces the overall time required for verification of the circuit design. The knowledge of the circuit designer is also captured through the creation of a database while verifying other requirements. For example, the designer indicates signals that he/she considers to be true or false about the design, such as, when a signal is high another signal should be low in the previous clock cycle. The system has a capability of taking the designer's information as fact or can determine the truth of the designer's information. In the latter case, verified information becomes a fact about the design and is added to the database.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF PREFERRED EMBODIMENTS

The present invention relates to guiding formal verification while verifying behavior of circuit designs. For the purposes of clarity, the following terms used herein are defined below.

An analysis region (as described in U.S. application Ser. No. 10/389,316, titled "Method for verifying properties of a circuit model", filed on Mar. 14, 2003 by Tempus Fugit Inc.) is a region that is used for formal verification of a circuit design. The analysis region comprises only a portion of the entire circuit design in the form of a gate-level netlist. The analysis region is used to verify the circuit design in accordance with specifications and assumptions of the circuit design.

Articulation points are defined as signals that convey specific micro-architectural information about the circuit design. This micro-architectural information includes the information related to the manner in which the signals are interconnected. For a circuit design, an articulation point can be a primary input, a register, a flip-flop or an internal wire.

The Fan-in of a signal is defined as a portion of a circuit that is driving the signal. The fan-in is obtained by traversing back from the selected signal.

The Articulated fan-in of a signal is defined as the fan-in obtained by traversing back from the selected signal till an articulation point is encountered. The portion of the fan-in beyond the articulation point is not included in the articulated fan-in.

A Recursive fan-in is defined as the fan-in of a selected signal obtained on traversing back from the selected signal until a primary input or a storage element is encountered.

The Reset portion associated with fan-in of a signal specifies the initial value of the signals, which forms the fan-in of the signal, at the beginning of the execution of the circuit. In general, the initial values of the signals are either all 'zeroes' or all 'ones'.

Figure 1:
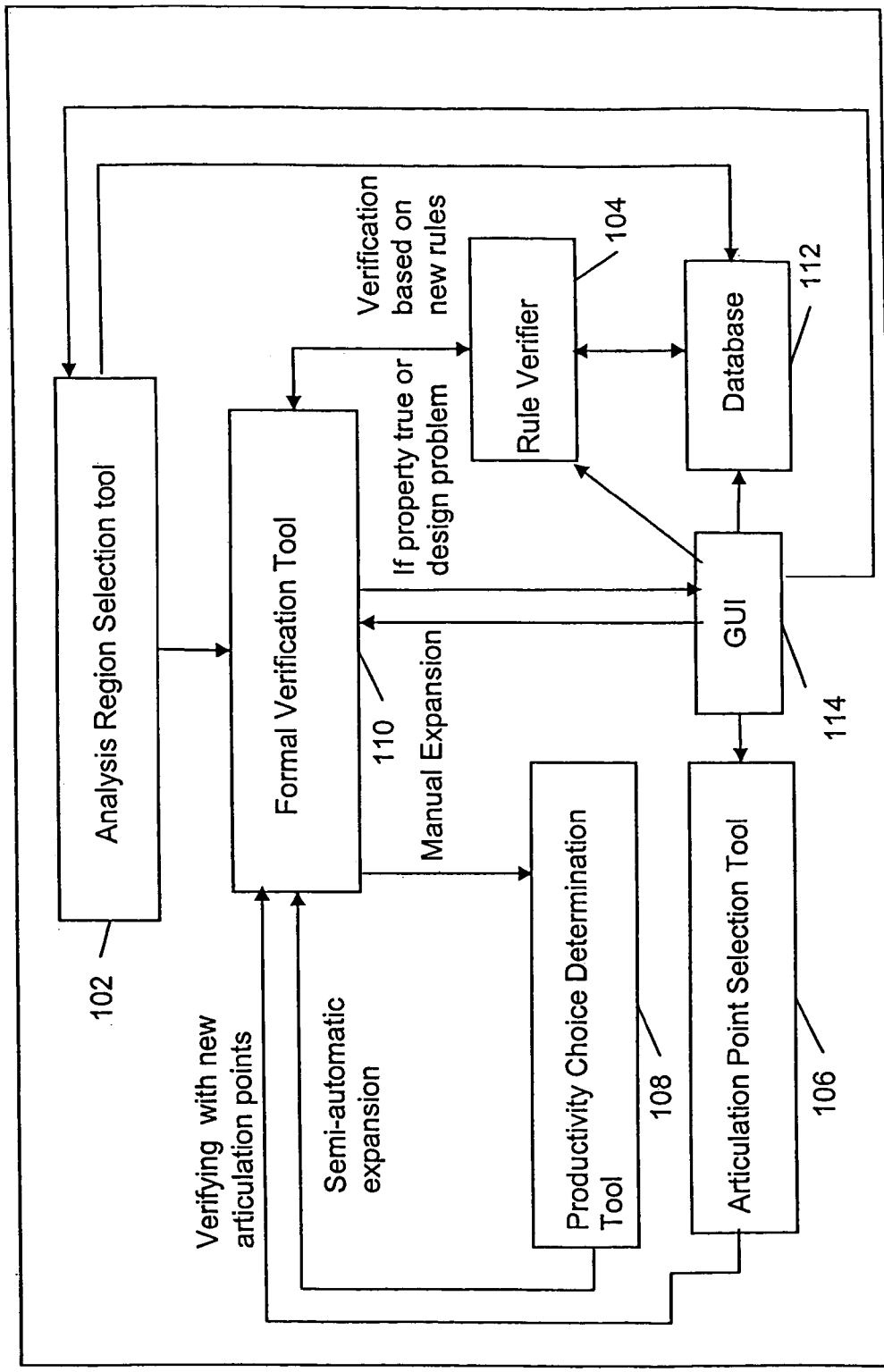
FIG. 1 is a block schematic of a Guided Formal Verification System.

FIG. 1 is a block schematic of a Guided Verification System 100 (henceforth referred to as System 100) for a circuit design in accordance with a preferred embodiment of the invention. System 100 includes an Analysis Region Selection tool 102, a Rule Verifier 104, an Articulation Point Selection tool 106, a Productivity Choice Determination tool 108, a Formal Verification tool 110, a Database 112 and a GUI 114.

System 100 uses a Register Transfer Level (RTL) source code as an input. The RTL-source code describes the circuit design in a high-level language such as Verilog and VHDL. System 100 converts RTL-source code into a gate-level netlist. Analysis Region Selection tool 102 selects an analysis region from the gate-level netlist. The verification of the analysis region is performed using Formal Verification tool 110. The process terminates if the circuit design gets verified in the analysis region or the user identifies an error in the circuit design. However, if the verification yields a false result i.e. in the analysis region the circuit design is not verified, System 100 allows a user to modify the analysis. Analysis is modified either by expanding the analysis region or defining new-rules as assumptions for the existing analysis region to verify the design. Further, System 100 displays the RTL-source code and waveforms of the signals defined in the RTL-source code using GUI 114. GUI 114 comprises a Source Code window to display a portion of the RTL-source code and a Plot window to display the waveforms of the signals. GUI 114 also enables a user to manually modify the analysis region without modifying the RTL source code.

System 100 uses manual, semi-automatic or automatic modification for verifying the circuit design. The modification is made more efficient by using the concept of an "articulation point". When circuit design verification in current analysis region yields a false result, the concept of articulation points enables the modification of the analysis region. While using an articulation point for modification, only the articulated fan-in is added or removed instead of traditional recursive fan-in. The articulated fan-in is typically smaller than recursive fan-in. When the analysis using the current analysis region is slow, the concept of articulation points enables removal of the fan-in of the articulation points from the region. This makes the analysis region smaller and thus analysis becomes faster.

For the purpose of the present invention, the articulated fan-in of a signal is defined as the fan-in of the selected signal obtained on traversing back from the selected signal until a primary input, a storage element or an articulation point is encountered. On the other hand, the prior art makes use of recursive fan-in to modify analysis region automatically. The present invention allows for the manual, the semi-automatic or the automatic addition or removal of the articulated fan-in to and from the analysis region.

System 100 allows use of internal wires apart from primary inputs, flip-flops and registers as articulation points. Articulation points present in the circuit design are identified by Articulation Point Selection tool 106 or specified by the user manually. The concept of the use of an articulation point to reduce the analysis region that is selected for verification is explained using the following example (hereinafter referred to as Example 1) of RTL-source code in Verilog.

```
0:  reg ff;
1:  always @(posedge clk) begin
2:    if (rst)
3:      ff <= 4'b0;
4:    else
5:      if(a && (b = 1'b1□c! = 4'b0101))
6:        ff <= ff + 4'b1;
7:      else
8:        ff <= ff – 4'b1;
9:    end
11: reg a;
12: wire b = d && e && f;
13: wire d = in && a;
14: wire e = in && ff[0];
15: wire f = in && ff[1];
16: reg [3:0] c;
```

Figure 2:
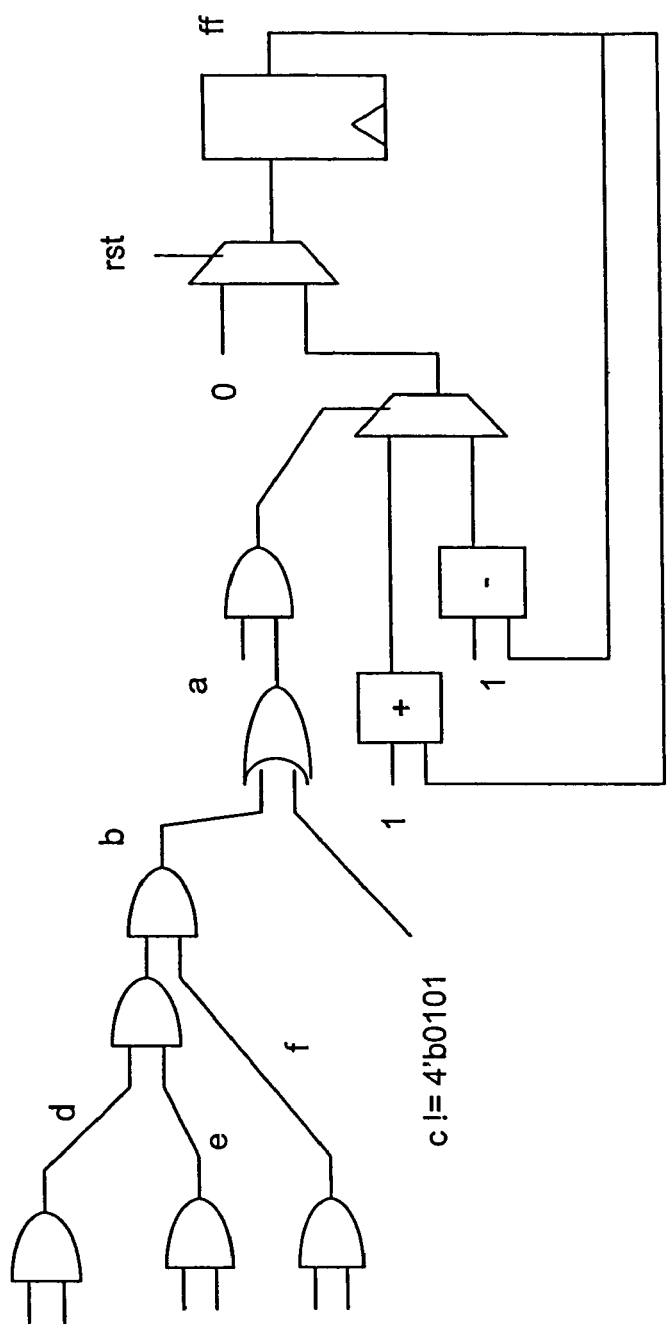
FIG. 2 represents the gate level circuit of an example of RTL-source code.

The following example illustrates the difference between the articulated fan-in and the recursive fan-in of signal ff. FIG. 2 represents the gate level circuit of the Example 1 RTL-source code. In Example 1, suppose register ff is the signal whose articulated fan-in is used for expansion, and further suppose that signal 315 (FIG. 3) has been chosen as an articulation point. The corresponding articulated fan-in of signal ff is shown using portion 301 in FIG. 3. The recursive fan-in is computed by traversing backwards from signal ff and stopping at the inputs of the circuit elements 305, 307, 309, 311, 317 and 313. The traversal stops at the inputs of these circuit elements because the inputs to these circuit elements are primary inputs, constants, or flip-flops. However, if the signal (a && (b=1'b1□c!=4'b0101)) is used as an articulation point, backward traversal stops at wire 315. Therefore, a smaller region is added to the analysis region (specifically the inputs to 305, 307 and signal 315).

Figure 4:
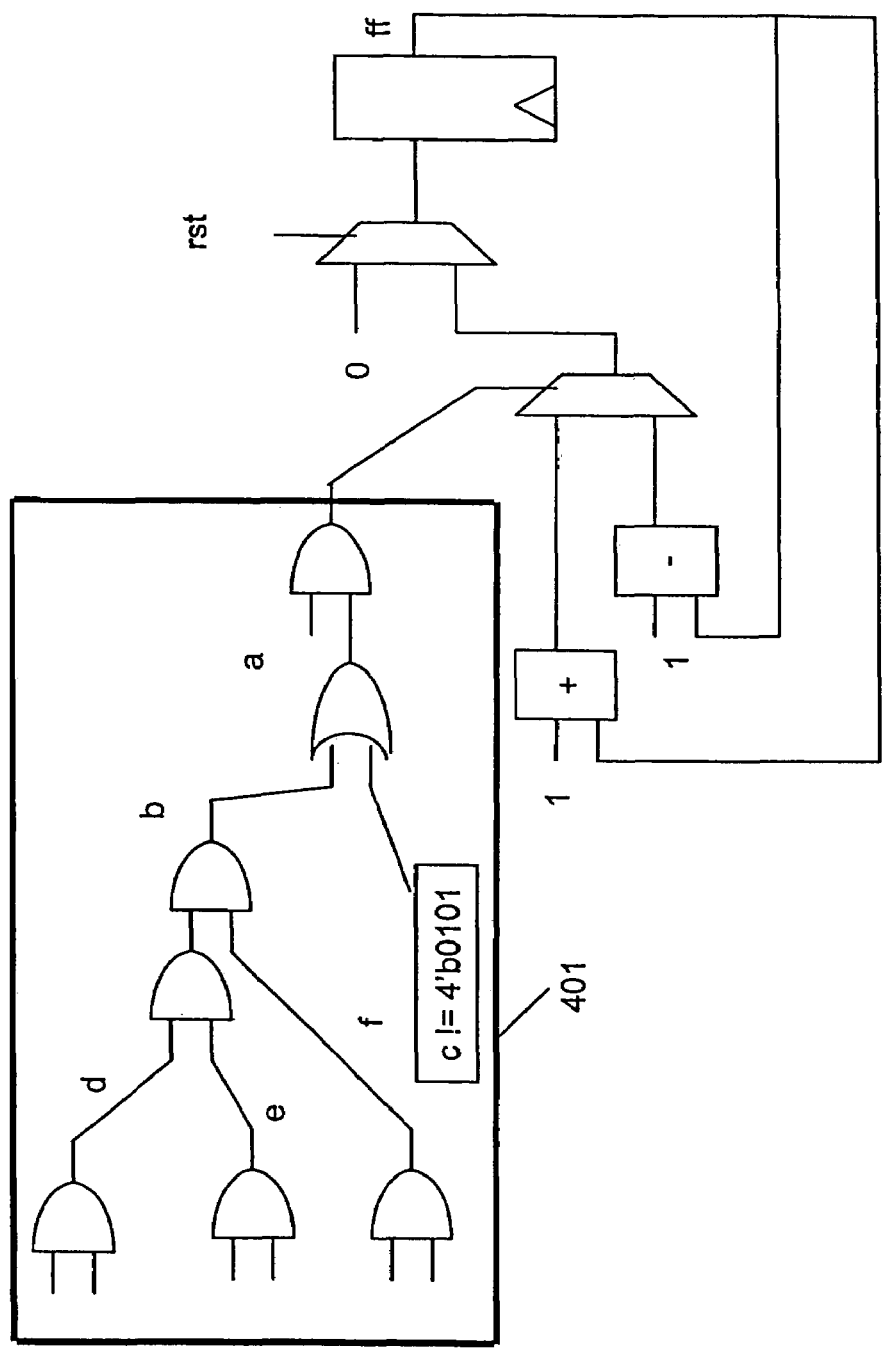
FIG. 4 shows the articulated fan-in of an expression of the RTL-source code corresponding to the gate level circuit shown in FIG. 2.
Figure 5:
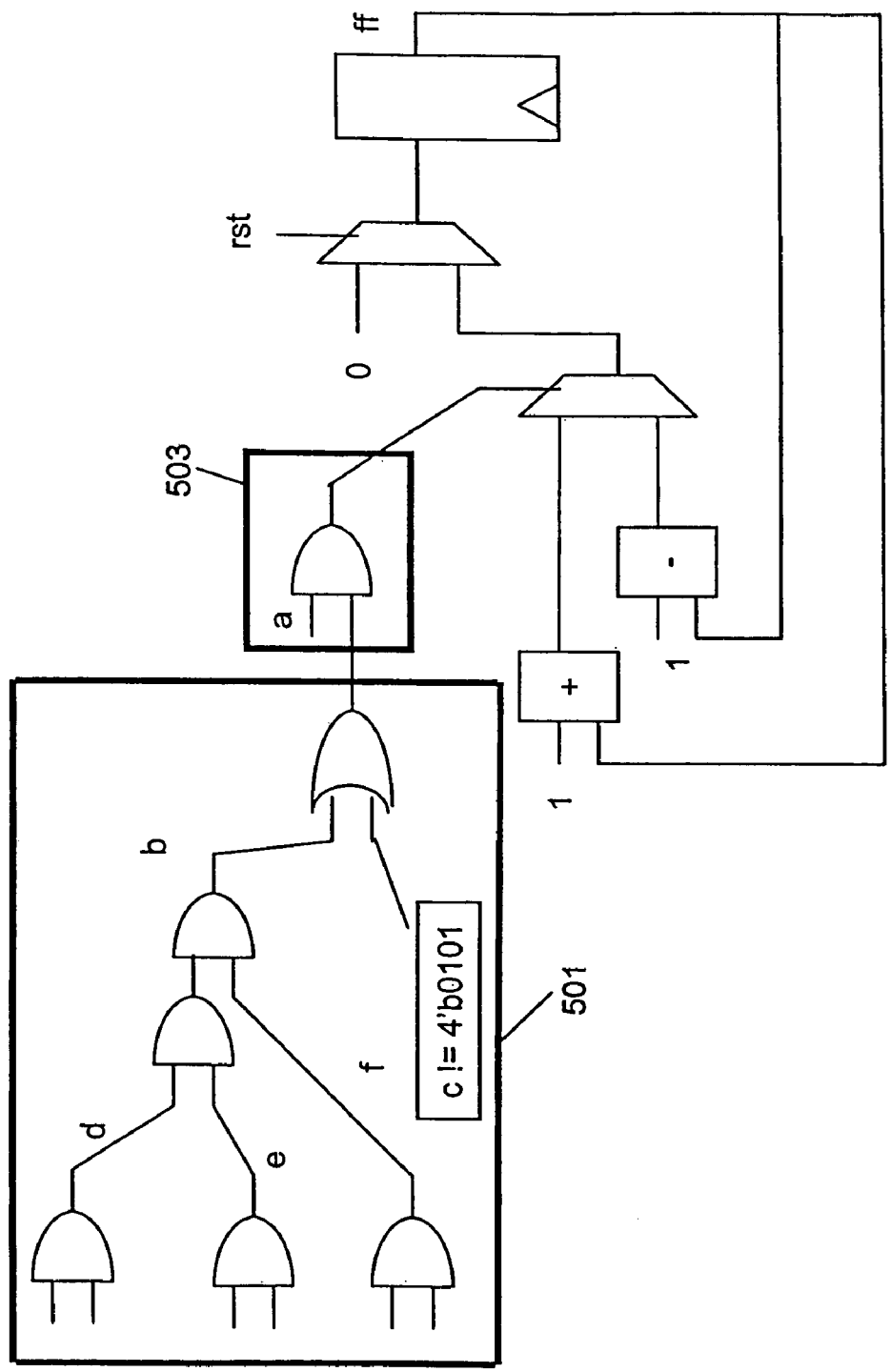
FIG. 5 shows the articulated fan-in of a sub-expression of the RTL-source code corresponding to the gate level circuit shown in FIG. 2.

Suppose later on, the articulated fan-in of signal (a && (b=1'b1□c!=4'b0101)) (as shown in line 5 in Example 1) is used for expansion. If there is no other articulation point, the articulated fan-in as shown using portion 401 in FIG. 4 is added to the analysis region. Suppose signal (b=1'b1□c!=4'b0101) is also used as an articulation, then only portion 503 in FIG. 5 is added to the region. The articulated fan-in of signal (b=1'b1□c!=4'b0101) is shown in FIG. 5 using portion 501. Articulation points are considered as independent signals for the purpose of verifying the analysis region. Hence, the signals driving these articulation points need not be considered while expanding the analysis region.

There are two main usages of an articulation point. If a user specifies an articulation point within the analysis region, the modified analysis region will be smaller since the recursive fan-in of the new articulation point is excluded. If a user specifies an articulation point outside the current analysis region, it is usually right before expansion of the region so that the next expansion (manual, or automatic) includes a smaller articulated fan-in of a candidate.

Figure 3:
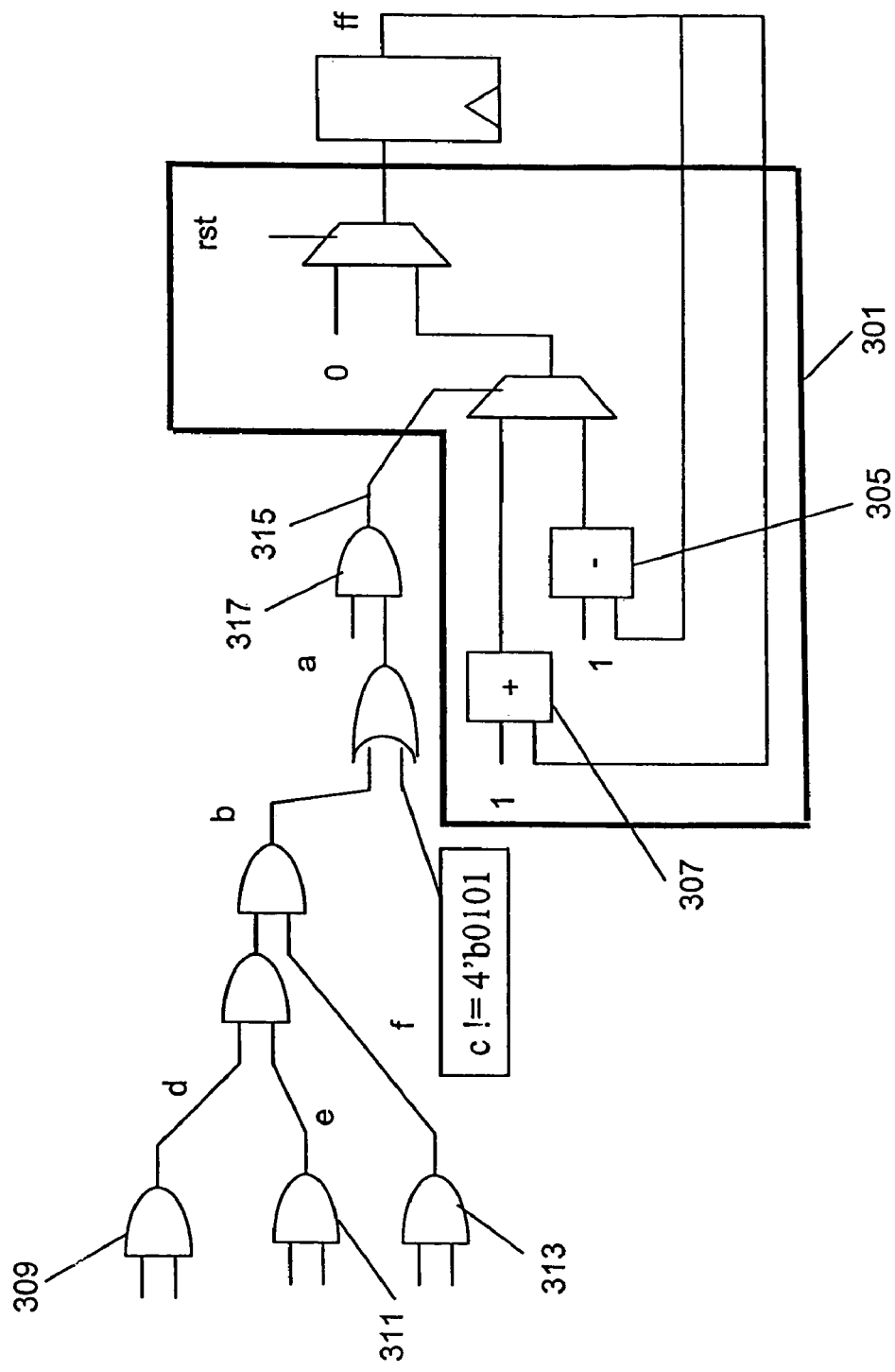
FIG. 3 shows the articulated fan-in of signal ff of the example gate level circuit provided in FIG. 2.

Furthermore, an articulation point can be used to construct a next state function by composition. The next state function is used to calculate values of a circuit element in the next clock cycle from the values of the inputs and circuit elements for the analysis region in the current clock cycle. For example, in FIG. 2, the next state function for signal ff depends on the value of signals, a, b, c, d, e and ff. If articulation point 315 of FIG. 3 is used to construct the next state function of ff, the next state function of ff is first computed in terms of the signal ff and signal 315. Then, the function for signal 315 is computed in terms of signals a, b, c, d and e, and finally the entire next state function of signal ff is computed by composing the two functions together appropriately. Each separate function typically is smaller and uses fewer signals thus making the overall analysis easier.

Figure 6:
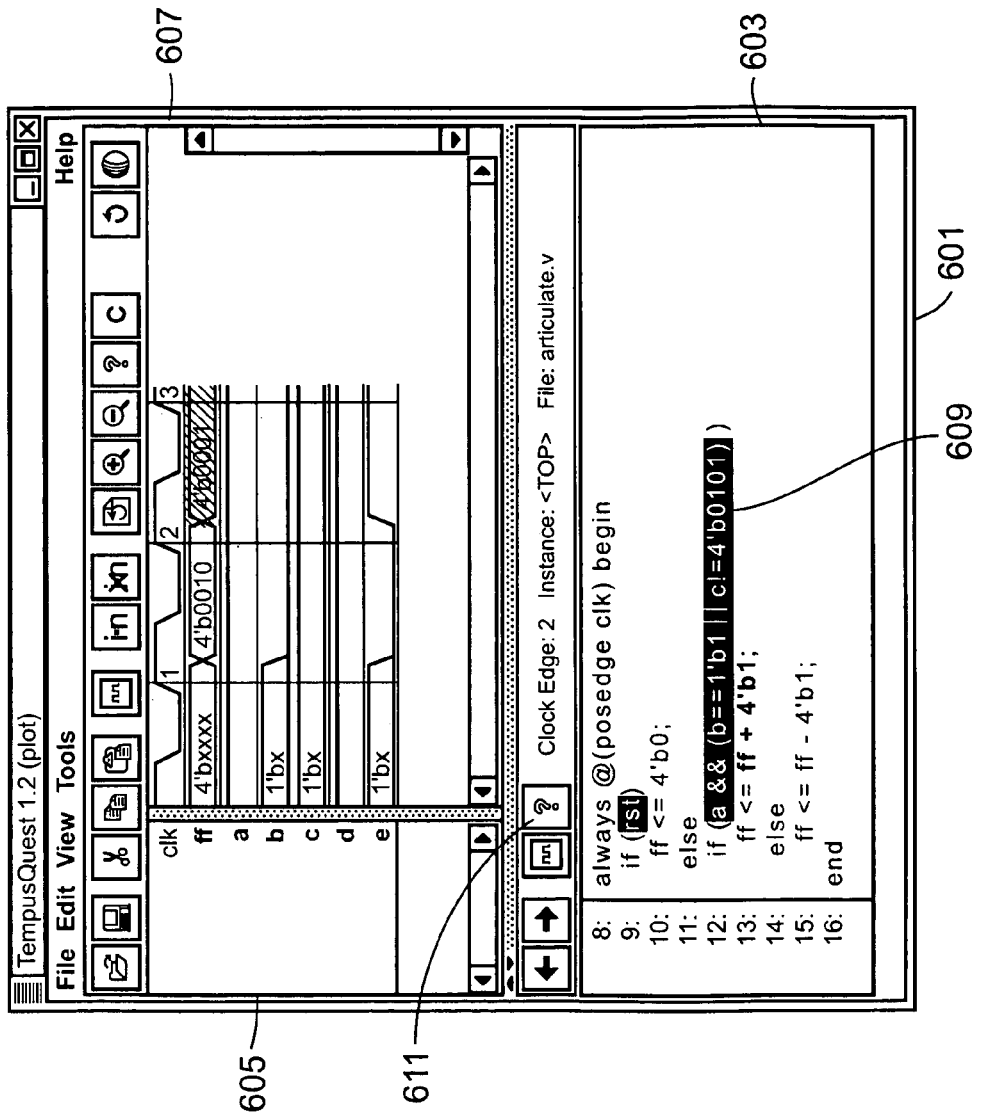
FIG. 6 is a GUI screenshot used to specify an expression as an, articulation point manually.
Figure 7:
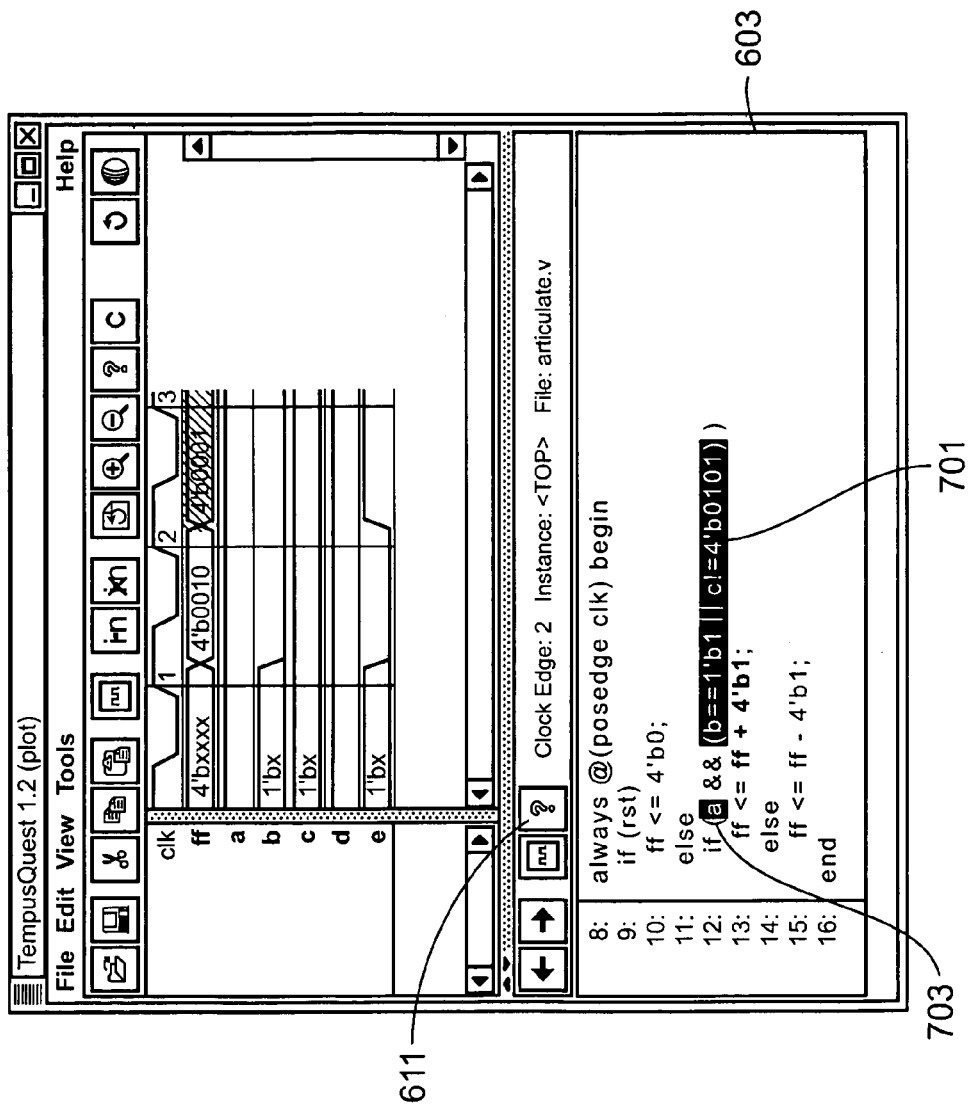
FIG. 7 is a GUI screenshot used to specify a sub-expression and a signal as articulation points manually.
Figure 8:
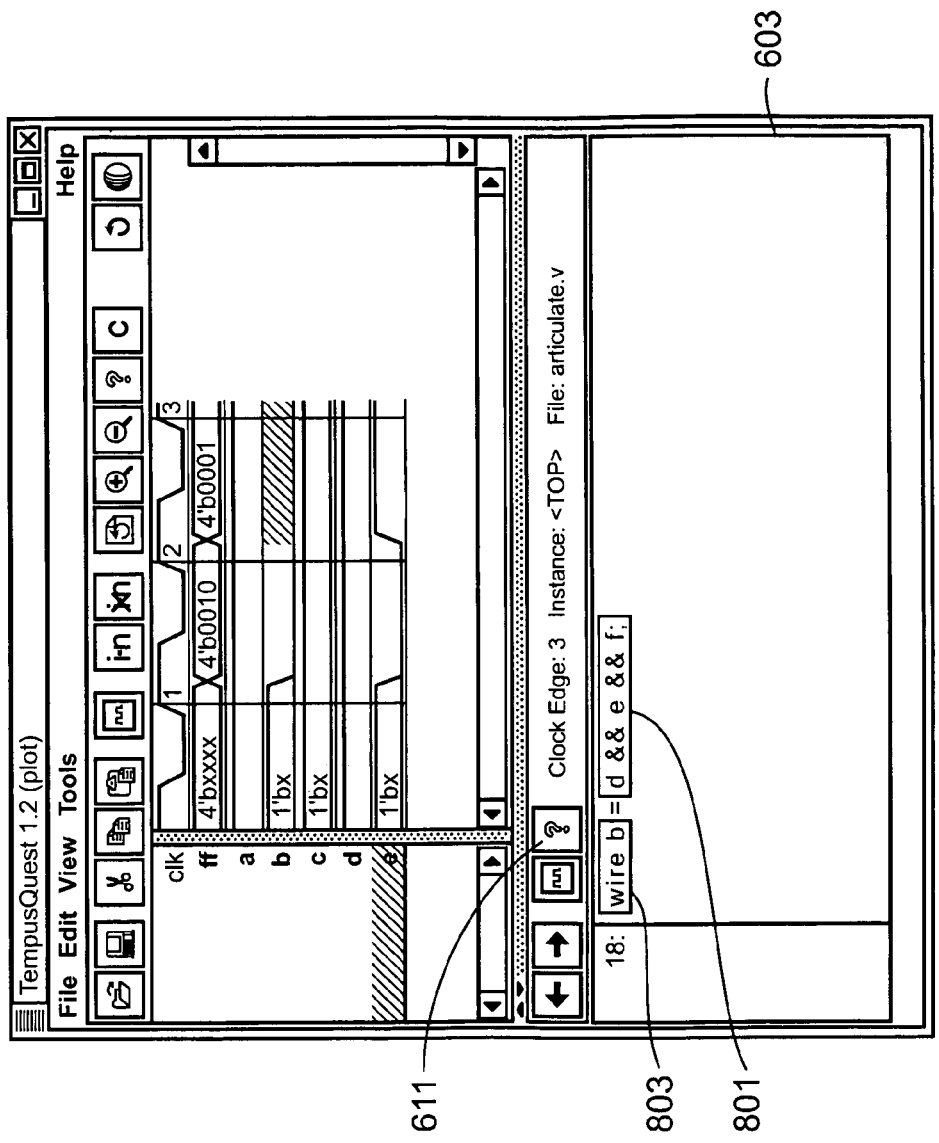
FIG. 8 is a GUI screenshot used to specify a wire as an articulation point manually.

System 100 of the present invention enables a user to specify articulation points through the Source Code window in GUI 114. Alternatively, automatic extraction of the articulation points is performed by analyzing common expressions used within the RTL-source code. Manual specification of articulation points is described with the help of FIGS. 6–8. FIG. 6 represents a GUI screenshot 601 used to specify an articulation point manually. In screenshot 601, the source code is displayed to the user in a Source Code window 603'. Various signals referred to in the displayed source code are listed in a Name List window 605 within a Plot window 607. Plots of various signals listed are also displayed in Plot window 607. To specify an articulation point, the user highlights an expression in Source Code window 603. The expression highlighted by the user corresponds to the one that needs to be specified as an articulation point. In FIG. 6, the user highlights expression 609, (a && (b=1'b1□c!=4'b0101)). After highlighting expression 609, the user clicks a Declare Articulation button 611. On clicking Declare Articulation button 611, expression 609 highlighted by the user is declared as an articulation point for System 100. Another example of specifying articulation points is shown using FIG. 7. In FIG. 7, the user highlights a sub-expression 701 and a signal 703 using Source Code window 603. Thereafter, the user clicks Declare Articulation button 611 to declare sub-expression 701 and signal 703 as articulation points. Another example for specifying articulation point is shown using FIG. 8. Using screenshot of FIG. 8, the user specifies a wire as an articulation point. In FIG. 8, the user highlights an expression 801 or a wire 803 in Source Code window 603. After highlighting expression 801 or wire 803, the user clicks Declare Articulation button 611. On clicking Declare Articulation button 611, expression 801 or wire 803 is defined as an articulation point for System 100.

As mentioned earlier, System 100 automatically extracts articulation points. System 100 extracts articulation points by analyzing common expressions used within the RTL-source code. Examples of automatically extractable articulation points include:

a) Comparison statements of wide signals, for example:
  reg [150:1] a, b;
  wire eq=(a==b);
  The equality comparison represents a circuit of 300 inputs. By using the signal 'eq' associated with equality comparison as an articulation point, only one input to the analysis region needs to be analyzed.

In the preferred embodiment, comparison statements of wide signals include—statements based on operators '=', '<', '<=', '>' and '>='.

b) Boolean guard of conditional statements, similar to expression 609 in FIG. 6.

In the preferred embodiment, conditional statements that are considered as articulation points include: case statements, 'if' statements and alternation operators. An example of an alternation operator is as follows:

Assign out=(cond ? in1:in2);

In this example, Boolean guard of alternation operator, i.e. signal cond is considered as an articulation point.

System 100 allows for modification of the analysis region through expansion. The expansion of the analysis region can be done manually, semi-automatically, or automatically.

Figure 9:
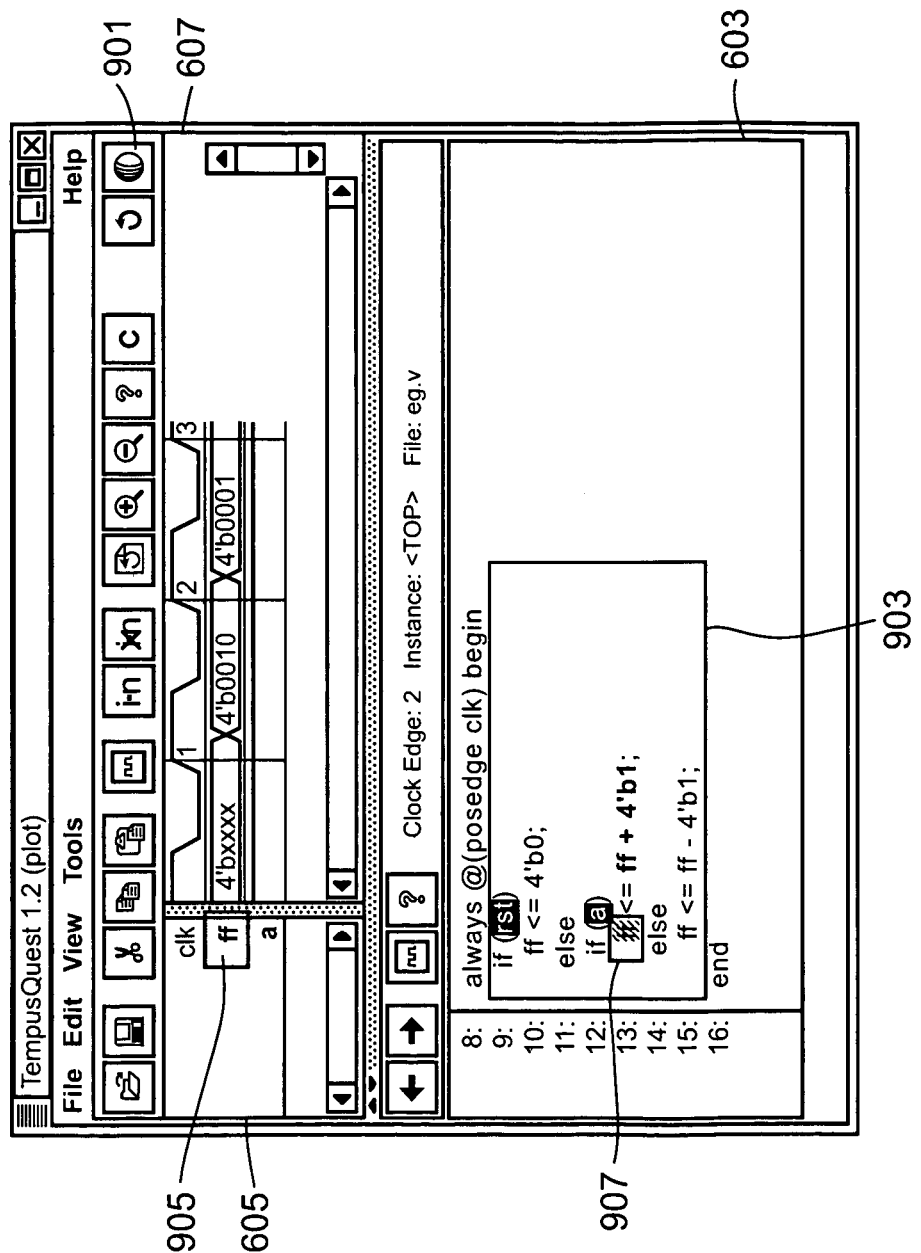
FIG. 9 is a GUI screenshot that displays the articulated fan-in of a signal that is selected by a user by clicking on the name of the signal.

Manual expansion of the analysis region involves the selection of a signal from the current analysis region. System 100 expands the analysis region by including the articulated fan-in driving the selected signal. This can be further illustrated using FIGS. 9–13. FIG. 9 is a screenshot of GUI 114 that displays an RTL-source code and plots of the signals associated with a current analysis region. The current analysis region comprises the following example (hereinafter referred to as Example 2) RTL-source code:

```
1: always @(posedge clk) begin
2:   if (rst)
3:     ff <= 4'b0;
4:   else
5:     if (a)
6:       ff <= ff + 4'b1;
7:     else
8:       ff <= ff - 4'b1;
9: end
```

For manual expansion of the complete articulated fan-in, the user is provided with options to select signals from Source Code window 603, Name List window 605 and Plot window 607.

The user can select a signal by clicking on name of the signal in Name List window 605 or in Source Code window 603. To select a signal, the user clicks on name of the signal and then clicks on an articulated fan-in button 901. On clicking button 901, the articulated fan-in of the selected signal is, added to the analysis region. For example, in case the user highlights signal ff (shown using box 905) in Name List window 605 and clicks button 901, System 100 identifies the articulated fan-in that drives signal ff. (a Box 903 illustrates the articulated fan-in thus determined. The articulated fan-in is represented using box 903 for illustration only. (System 100 does not present the articulated fan-in to the user.) The articulated fan-in is then added to the analysis region. Alternatively the user selects a signal from Source Code window 603. For example, the user highlights signal ff, shown using box 907, in Source Code window 603. Once the signal is selected and the user clicks button 901, the same articulated fan-in (illustrated using box 903) is added to the analysis region.

Alternatively, the user can select a signal from Plot window 607. This is illustrated in FIGS. 10–13. Selecting a signal in Plot window 607 at a specific time cycle and with a value presents the user with many choices, instead of always including the entire articulated fan-in that drives the signal. The choices provided to the user for expanding the analysis region are:

a) The entire articulated fan-in of the selected signal b) A reset-related portion of the articulated fan-in of the selected signal c) The entire non-reset-related portion of the articulated fan-in of the selected signal d) A subset of the non-reset-related portion of the articulated fan-in of the selected signal that is 'turned-on'

Figure 10:
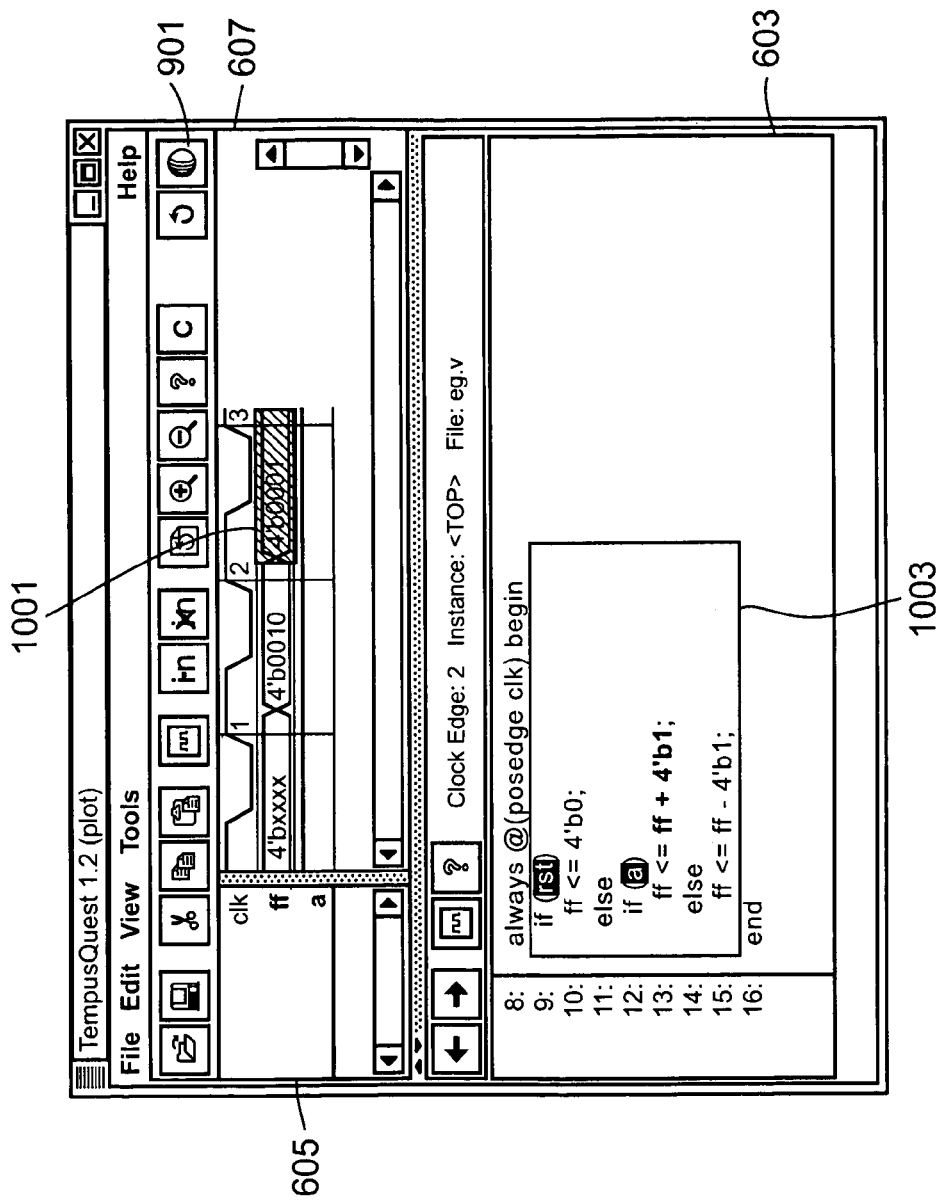
FIG. 10 is a GUI screenshot that displays the articulated fan-in of a signal that is selected by a user by clicking on the plot of the signal at a specific time cycle.

To add the entire articulated fan-in of a signal, the user selects a signal by clicking on the plot of the signal in Plot Window 607. As shown in FIG. 10, the user highlights the plot of signal ff at time cycle 3 by clicking. The highlighted portion is shown using box 1001. After selecting the signal, the user clicks button 901. On clicking button 901, System 100 determines the articulated fan-in of the selected signal. The articulated fan-in of signal ff, as shown using box 1003, is then added to the analysis region.

System 100 allows the user to select a reset or a non-reset portion of the articulated fan-in that drives a selected signal. If the user selects a signal at time cycle just after reset of the circuit design, System 100 allows for the addition of a reset portion of the articulated fan-in to the analysis region. Similarly, if the user selects a time cycle other than just after the reset of the circuit design, System 100 provides the user the option of adding only the non-reset portion of the articulated fan-in of the selected signal to the analysis region.

Figure 11:
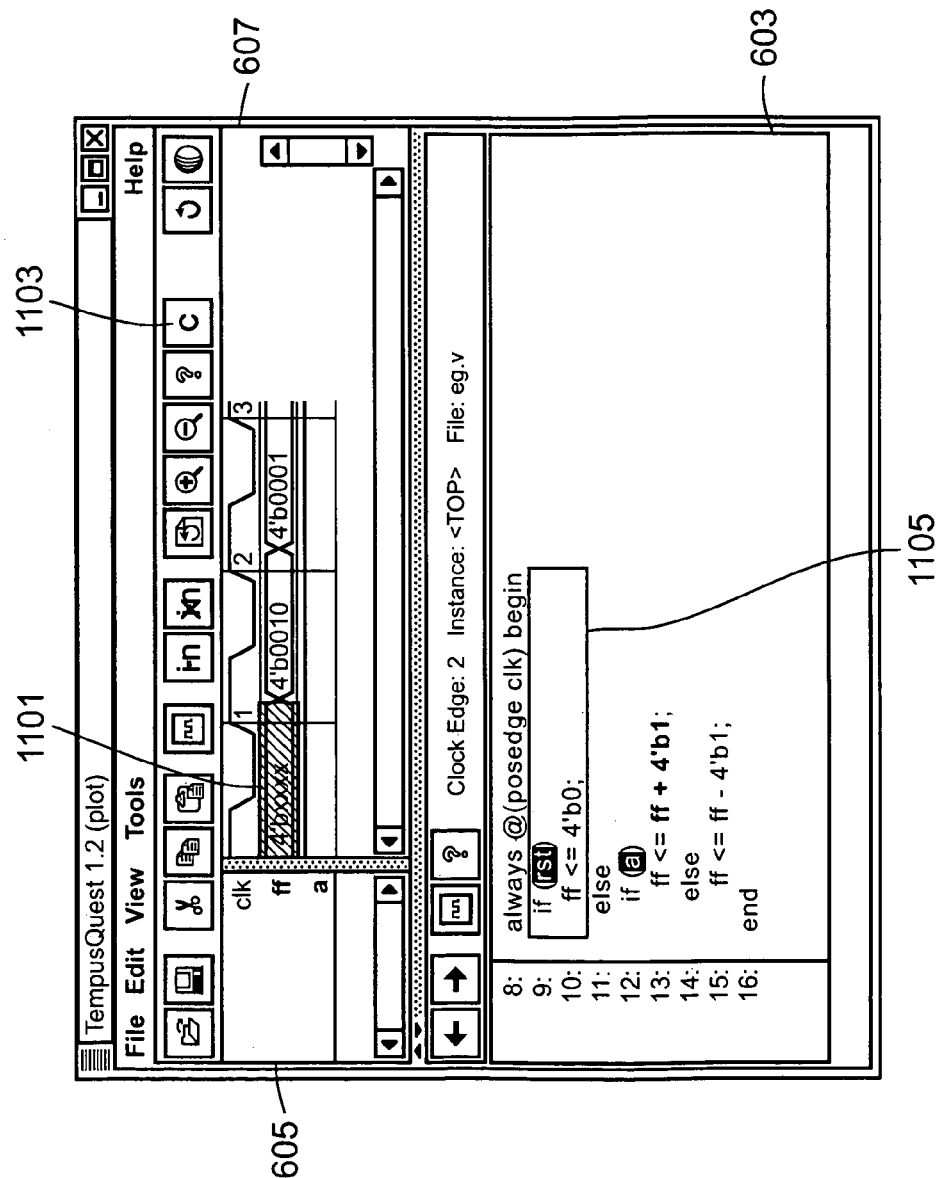
FIG. 11 is a GUI screenshot that displays reset portion of the articulated fan-in of a signal that is selected by the user by clicking on the plot of the signal at a time cycle just after reset.

To add the reset portion of the articulated fan-in of a signal, the user selects the signal just after reset, as shown in FIG. 11. As shown in FIG. 11, the user selects signal ff by clicking on plot of signal ff at time cycle 1 just after reset. The signal highlighted is shown using box 1101 in Plot window 607. After selecting the signal just after reset, the user clicks on Partial Articulated Fan-in button 1103. System 100 then identifies the reset related portion of the articulated fan-in of signal ff. The reset related portion, shown using box 1105, is added to the analysis region.

Figure 12:
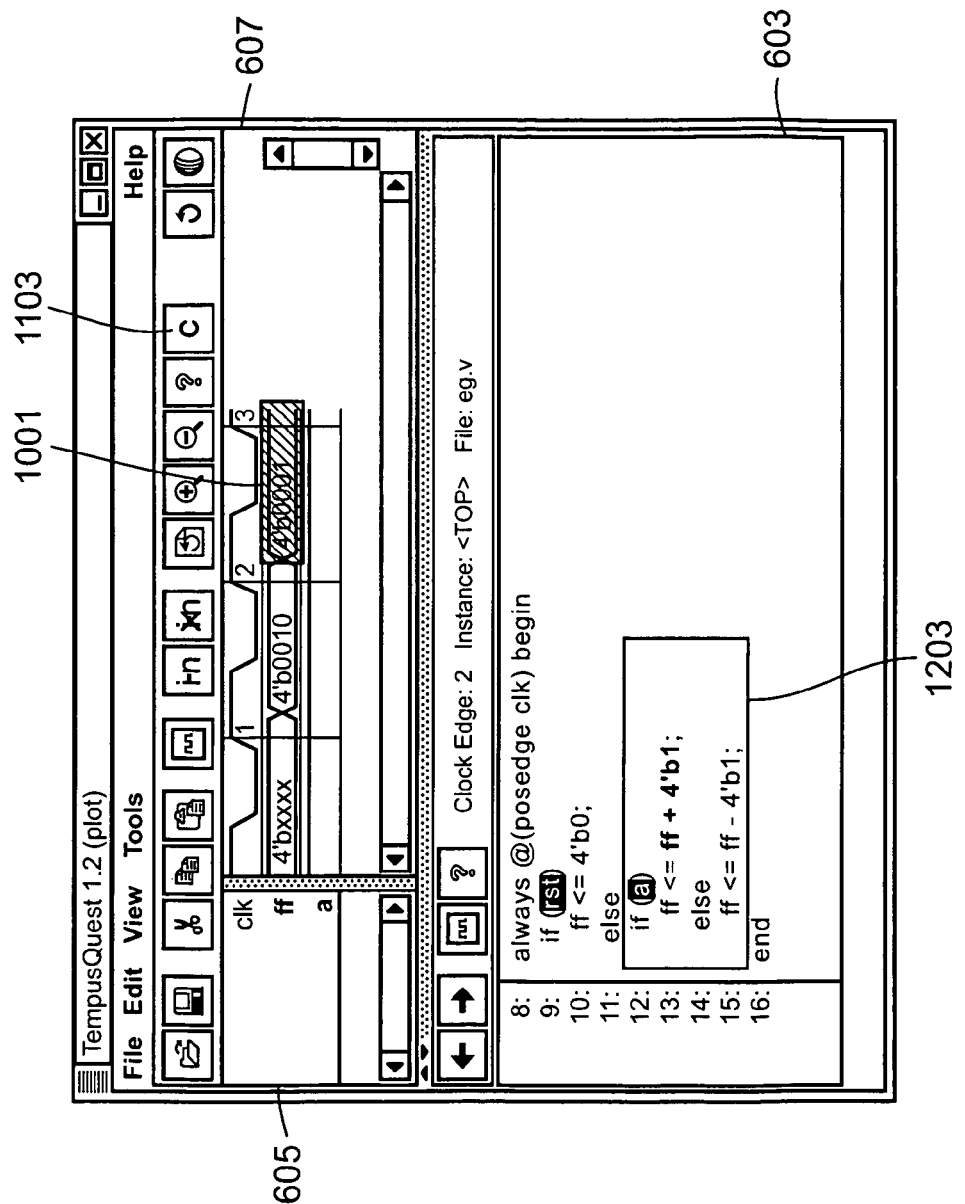
FIG. 12 is a GUI screenshot that displays non-reset portion of the articulated fan-in of a signal that is selected by the user by clicking on the plot of the signal at a time cycle other than just after reset.

To add non-reset related portion of the articulated fan-in of a signal, the user selects the signal at a time cycle other than just after reset of the circuit design. As shown in FIG. 12, the user selects signal ff by clicking on plot of signal ff at time cycle 3 after reset in Plot window 607. The signal highlighted is shown using box 1001 in Plot window 607. After selecting the signal at a time cycle other than just after reset, the user clicks on Partial Articulated Fan-in button 1103. System 100 then identifies the non-reset related portion of the articulated fan-in of signal ff. The non-reset related portion, shown using box 1203, is added to the analysis region.

Figure 13:
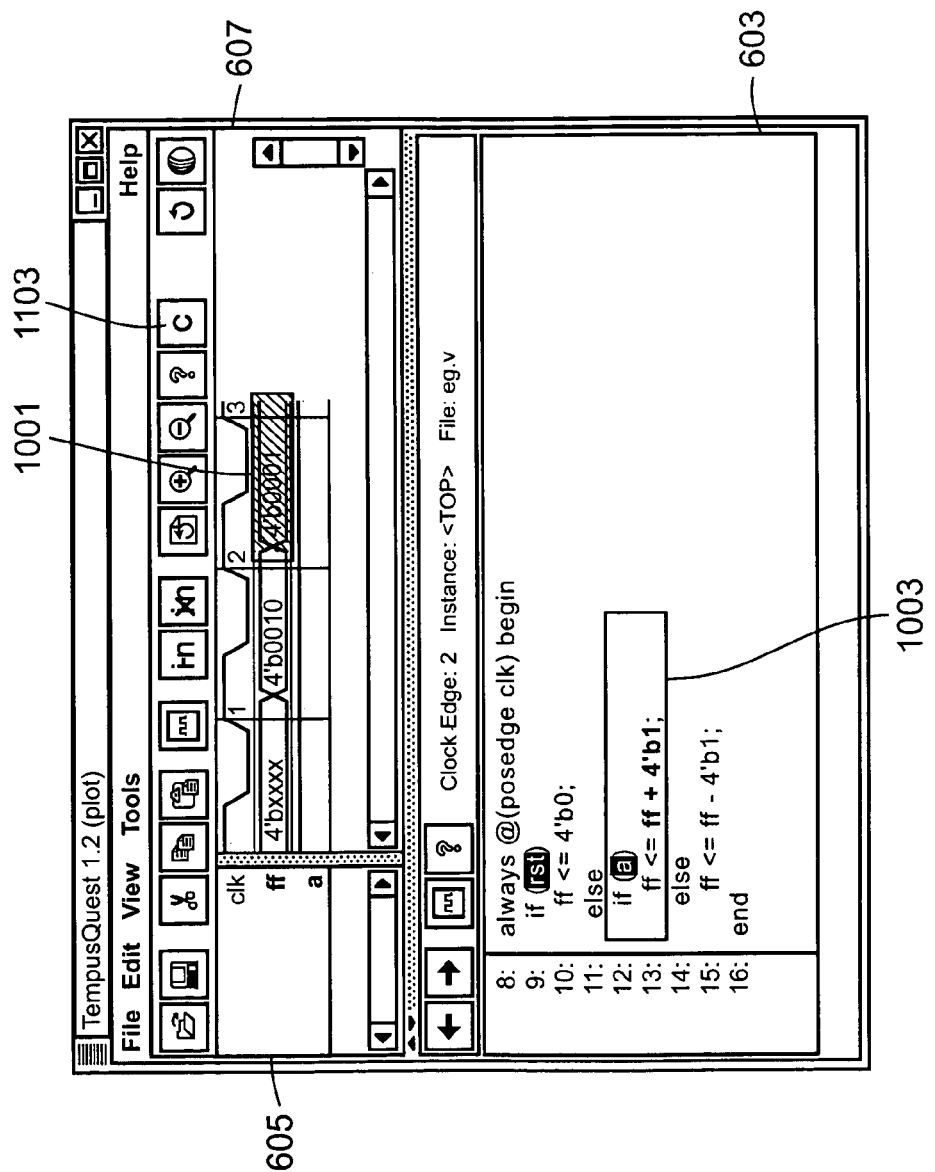
FIG. 13 is a GUI screenshot that displays a 'turned-on' portion of the articulated fan-in of a signal that is selected by the user at a specific time cycle.

System 100 also provides the user with the choice of selecting only the portion of the articulated fan-in of the selected signal that is 'turned on' by current values of signals in the analysis region at a specific time cycle. This ensures that the portion that is 'turned off' during the specific time cycle is not included during verification using the expanded analysis region. This simplifies verification since the portion of the articulated fan-in of the selected signal that is not required for verification is not added to the analysis region. Thus, System 100 allows the user to select only a subset of the non-reset portion of the articulated fan-in. To add a subset of non-reset related portion of the articulated fan-in of a signal that is 'turned on', the user highlights the signal using Plot window 607. As shown in FIG. 13, the user selects signal ff by clicking on plot of signal ff at time cycle 3 after reset. The signal highlighted is shown using box 1001 in Plot window 607. After selecting the signal at a time cycle other than just after reset, the user clicks on Partial Articulated Fan-in button 1103 while pressing the shift key (without pressing the shift key, the entire non-reset articulated fan-in is added, as shown in FIG. 12). System 100 then identifies the portion of the articulated fan-in of signal ff that is turned-on by the current values of the signals in the analysis region at time cycle 3. The portion of the articulated fan-in of signal ff that is turned on, shown using box 1303, is added to the analysis region. In a preferred embodiment, the simultaneous use of Partial Articulated Fan-in button 1103 and the shift key adds a portion of the articulated fan-in of a selected signal that is tuned-on by current values of signals in the analysis region. However, it should be obvious to one skilled in the art that numerous other embodiments are possible to specify that only a portion of the articulated fan-in needs to be added to an analysis region.

Apart from the manual modification of the analysis region described above, System 100 also allows for the automatic and semi-automatic modification of the analysis region. This involves expansion of the analysis region based upon a productivity algorithm and user defined directives to System 100 at appropriate time cycles. System 100 has a Productivity Choice Determination tool 108 to determine an analysis region modification choice for expanding the analysis region. Productivity Choice Determination tool 108 is based upon the productivity algorithm. A set of candidate signals for the analysis region modification choice is generated by examining Database 112 and counter examples, where the counterexamples relate to the failure of the verification process in the current analysis region. The initial set of candidates is a set of articulation points whose values must be changed to invalidate the counter examples. Another supplementary set of candidates is a set of articulation points that are initially stored in Database 112.

The productivity algorithm classifies the candidates for the current analysis region by their perceived productivities and only promising candidates with high productivity weights are automatically used to expand the analysis region.

The productivity weights for each choice are based on productivity assignments for various parameters defining the productivity of the choices. The parameters determining the productivity of a choice include:
 a) Candidates in the requirement description and at the frontier of the circuit design (driving the outputs of the design)
 b) Finite state machines associated with the choice
 c) Candidates that are obtained through a counter example trace of length 1
 d) Candidates that are related to the current analysis regions through assumptions
 e) Candidates that are related to a rule in the database
 f) Candidates that are both driven by the logic in the current analysis region and driving the boundary inputs to the analysis region
 g) The complexity of the corresponding articulated fan-in
 h) Candidates whose value is inconsistent with 3-value simulation, of the analysis region
 i) Candidates whose value is inconsistent with 3-value simulation of a portion of the design that is larger than the current analysis region
 j) Candidates that are counters
 k) Candidates that represent wide signals An example of the productivity assignments to weight each choice based upon the above parameters is described as follows:
 a) Weight '+10': usually it is productive to add the articulated fan-in of candidates that are close to the requirement.
 b) Weight '+10': usually it is productive to add the articulated fan-in of a finite state machine state.
 c) Weight '+10': usually it is productive to add the reset logic of the candidates obtained from a counter example of length 1.
 d) Weight '+5': usually it is somewhat productive to add the articulated fan-in of candidates that are related to the current analysis region through an assumption.
 e) Weight '+30': usually it is highly productive to add the articulated fan-in of candidates that are related to the current analysis region through a rule in the rule database.
 f) Weight '+20': usually it is highly productive to add the articulated fan-in of candidates that are indirectly driven by the logic in the analysis region.
 g) Weight '−50': usually it is not productive to add the articulated fan-in with high complexity.
 h) Weight '+20': usually it is productive to add the articulated fan-in of candidates that have inconsistent values in the counter example and in a 3-value simulation of the analysis region
 i) Weight '+40': usually it is highly productive to add the articulated fan-in of candidates that have inconsistent values in the counter example and in a 3-value simulation of a region larger than the analysis region.
 j) Weight '−1000': usually it is very unproductive to add a counter to an analysis region.
 k) Weight '−100': usually it is unproductive to add a wide signal of more than 4 bits.

After assigning weights to each choice, the choices are ranked according to the weight. For example, to expand an analysis region of a circuit design, the choices available are candidate A, candidate B and candidate C. The candidates have weights—candidate A: 40, candidate B: 20, candidate C: −980. Then, the user adds the articulated fan-in of candidate A and candidate B to the analysis region and candidate C is not added.

The above productivity assignment is only one of the possible embodiments. It should be obvious to one skilled in the art that other productivity assignments are also possible.

The productivity algorithm also decides the selection of the choice based upon the following rules:
 a) The articulated fan-in of a candidate with negative weight is never added automatically. They are presented to the user and only added if the user manually justifies them.
 b) If there are more than, say 5 candidates with positive weights, only the 5 candidates with the highest weights are added automatically.
 c) When all candidates have negative weights, the automatic process stops. System 100 presents a counterexample and a list of possible choices (but with negative weight) to the user.

Further, when the design complexity is really high, this algorithm can be modified so that no candidate is added automatically, and the perceived productivities are presented to the user for a manual selection.

In case there are no high-productivity choices, the user decides manually using circuit design knowledge, which of the following steps should be taken.
 a) Expand the region on candidates that are deemed not high-productivity.)
 b) Attach an abstraction to the choices instead of expanding the region and then put in an assumption relating the abstract state machine and the candidate signal. For example, consider the following RTL-source code in Verilog, and suppose that the candidate signal is named candidate.

```
1. reg[1:0]abstractStateMachine;
2. always @(posedge clk) begin
3.   if (rst) . . .
4.   else begin
5.     case (abstractStateMachine) begin
6.       2'b00 : if (sigA) abstractStateMachine <= 2'b11;
7.       2'b01 : . . .
8.     end
9.   end
10. end
```

In the above example, an assumption based on the abstraction can be:

candidate==(abstractStateMachine==2'b11) && sig

The effect of this assumption is that the signal candidate is, in effect, driven by the logic '(abstractStateMachine==2'b11) && sig'. Thus, while defining an abstraction, new logic is defined and used with the design to be verified.

c) Attach an assumption to the choices instead of expanding the region. For example, in the RTL-source code above, the user can define an assumption for the signal: candidate (sigA && (sigB∥sigC)).

The effect of this assumption is that the signal candidate is, in effect, driven by the logic (sigA && (sigB∥sig C)).

d) Decide that there is actually a problem in the design.

Thus, System 100 allows the user to make a decision regarding the modification of the analysis region based upon the choices generated. This semi-automatic expansion of the analysis region avoids excessive analysis time in case scenarios b), c), or d) occurs.

System 100 allows for the automatic, semi-automatic and manual modification of an analysis region. Repeated modification of analysis region provides appropriate intermediate checkpoints from which a user draws conclusion about the presence (and the exact location) of a design error. The user draws conclusion from the partial information provided by System 100, instead of attempting to keep expanding the region until a conclusive result is obtained. When there is no high-productivity candidate available, System 100 stops. The user then has a chance to look at the counterexample and determine if the design has an error.

System 100 also allows the user to modify the analysis by defining new rules. The user defines a new rule by selecting a set of signals in Plot window 607. Further, System 100 generates a set of triples based upon the selected set of signals. A triple is defined in the format:

<name of the selected signal, the specific time cycle after reset at which signal is selected, and the value of the selected signal at specific time cycle>

The set of signals may comprise only one signal at a specific time cycle or a plurality of signals, each of the signals being selected at a specific time cycle. The method of selection of the new rule can be explained using Example 2.

Figure 14:
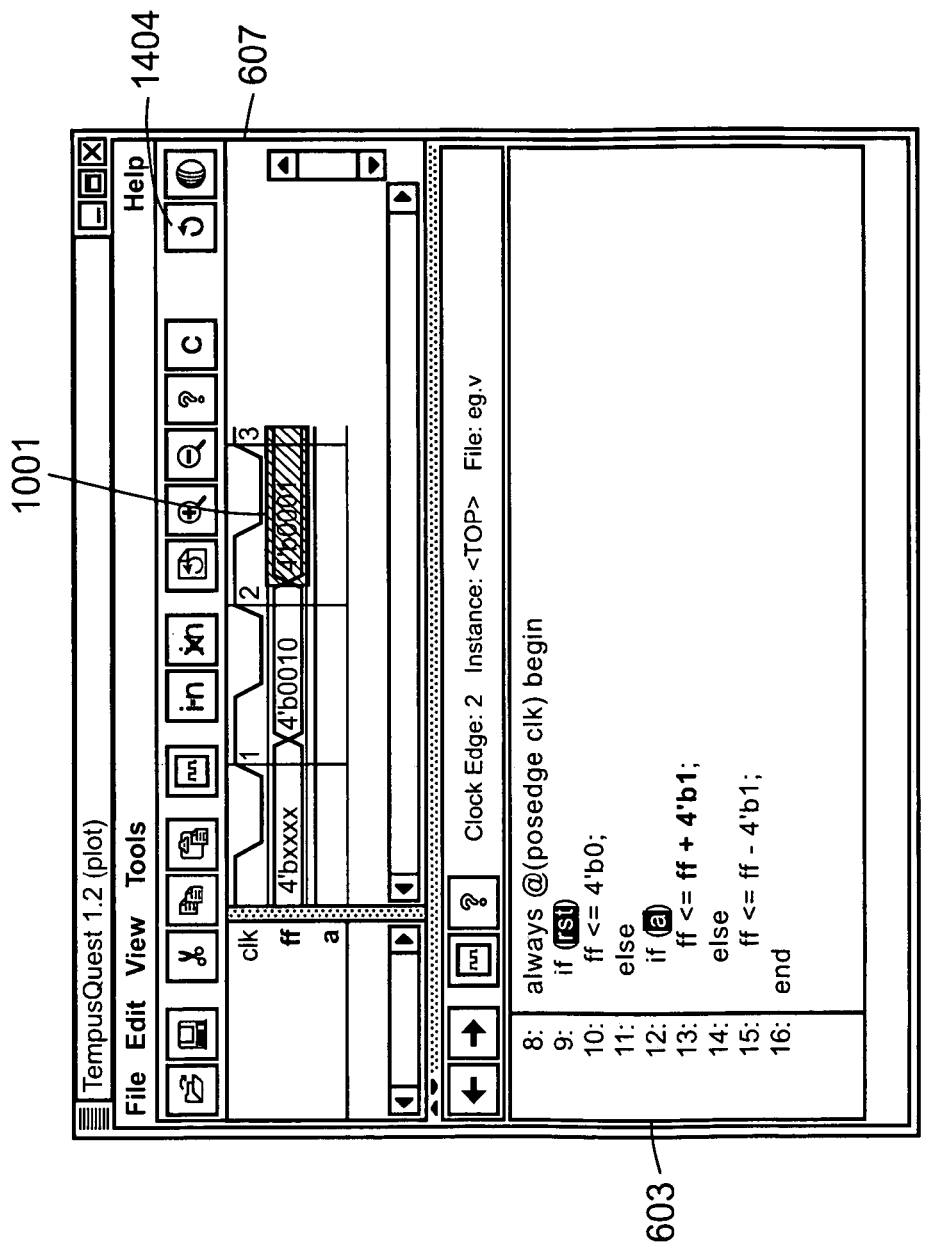
FIG. 14 is a GUI screenshot that allows the user to define a rule by selecting a signal at a specific time cycle.

Suppose, the user wishes to create a new rule defined as "ff should not have value 4'b0001". To define the rule, the user selects signal ff at a specific time cycle from Plot window 607 in GUI 114. System 100 then generates a triple corresponding to signal ff. Subsequently, the rule corresponding to the triple is defined. This is further illustrated using FIG. 14. FIG. 14 is a screenshot that shows RTL-source code in Source Code window 603 and the plot of signals in Plot window 607. The user clicks on signal ff at time cycle 3 1001 in Plot window 607. Signal ff at time cycle 1001 has a value defined as 4'b0001. A rule is then created using the selected signal ff at time cycle 3 1001 by Clicking on a Time Rule Creation button 1404. The selection of signal ff at time cycle 3 1001 also results in the generation of a triple defined as <ff, 3, 4b'1>.

A rule corresponding to a triple specifies that the signal in the triple should not have a value as defined in the triple at the time cycle specified in the triple. Thus, rule corresponding to triple <ff, 3, 4b'1> in FIG. 14 is signal ff should not have a value of 4b'0001 at time cycle 3 after the design is reset. The generated triple is stored in Database 112.

The rule generated from the triple may specify time cycles either absolutely (as in "this condition should not happen at these specific time cycles after reset) or relatively (as in "this condition pattern should not occur at any time cycle, with the actual time cycle in the triple having only meaning in a relative sense). The previous example shows the former case, and the next example shows the latter case.

Figure 15:
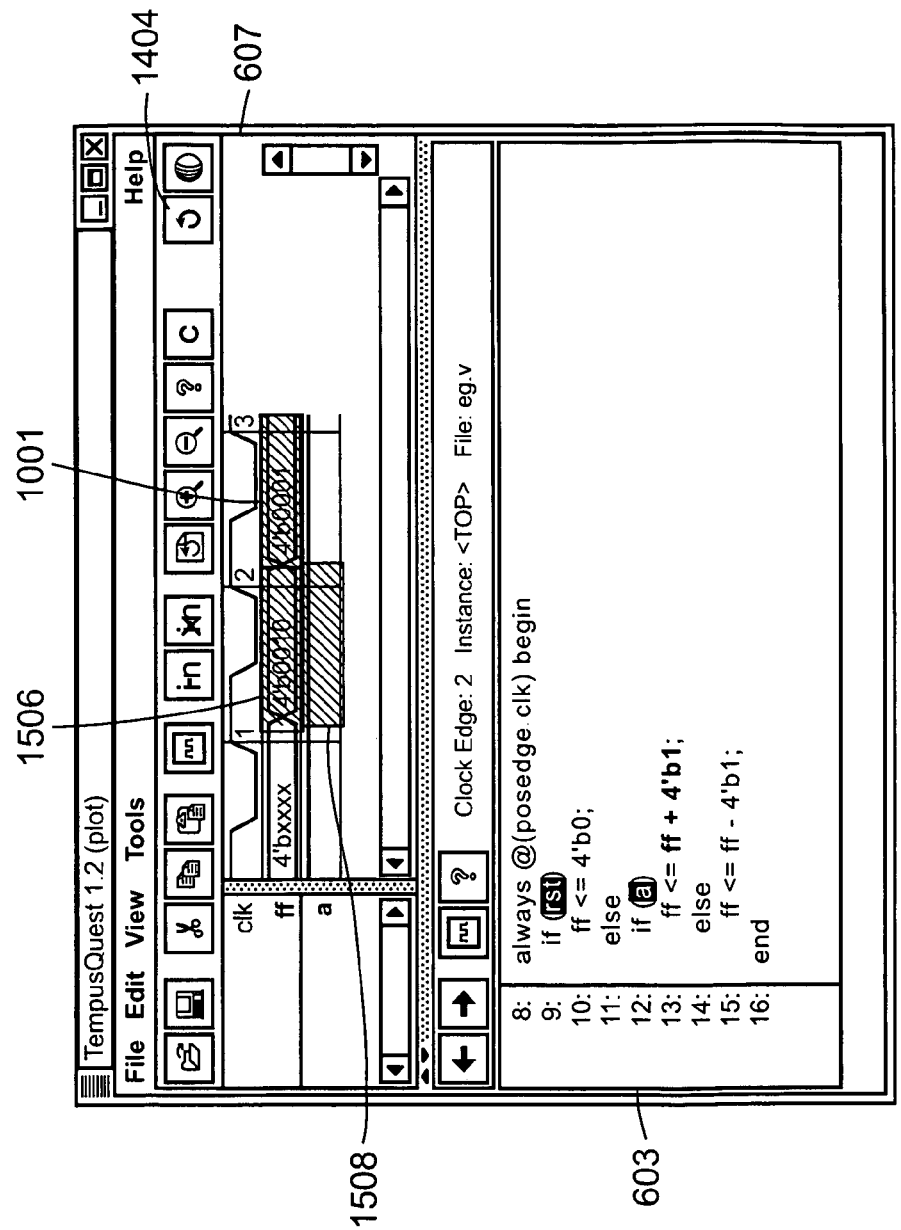
FIG. 15 is a GUI screenshot that allows the user to define a rule by selecting a plurality of signals, each signal corresponding to a specific time cycle.

The user can also define the new rule based on a plurality of signals. The rule generated using plurality of signals is also referred to as a complex rule. The rule is defined based on the selection of signals at specific time cycle by the user. Further, System 100 generates a set of triples based on the selected signals. This selection is further illustrated using the screenshot shown in FIG. 15 for the RTL source code of Example 2. To create a complex rule, the user selects signal ff at time cycle 3, 1001 and signal ff at time, cycle 2, 1506. Also, the user selects signal a at time cycle 2 1508. The signals are selected at time cycles relative to each other. In the above example, signal ff is chosen at time cycles consecutive to each other, i.e. cycles 2 and 3. Signal a is chosen at time cycle 3, the same as that of one of the cycles at which signal ff is chosen. The complex rule is then created using the selected signals by clicking Time Rule Creation button 1404 along with pressing the shift key. Pressing a Time Rule Creation button 1404 while pressing the shift key enables the user to define rules on the basis of relative time cycles. Thus, in the case of plurality of signals, Rule Creation button 1404 creates a rule on the basis of relative time cycles of the signals. System 100 also generates the set of triples based on selected signals 1001, 1406 and 1408. The triples generated are <ff, 3, 4'b1001>, <ff, 2, 4'b1010> and <a, 2,1>. Utilizing the relative time approach, based on the set of triples, this new rule is defined as "ff should not have value 4'b0001 if, in the previous clock cycle ff has value 4'b0010 and signal a has value 1". The triples are stored in Database 112.

Figure 16:
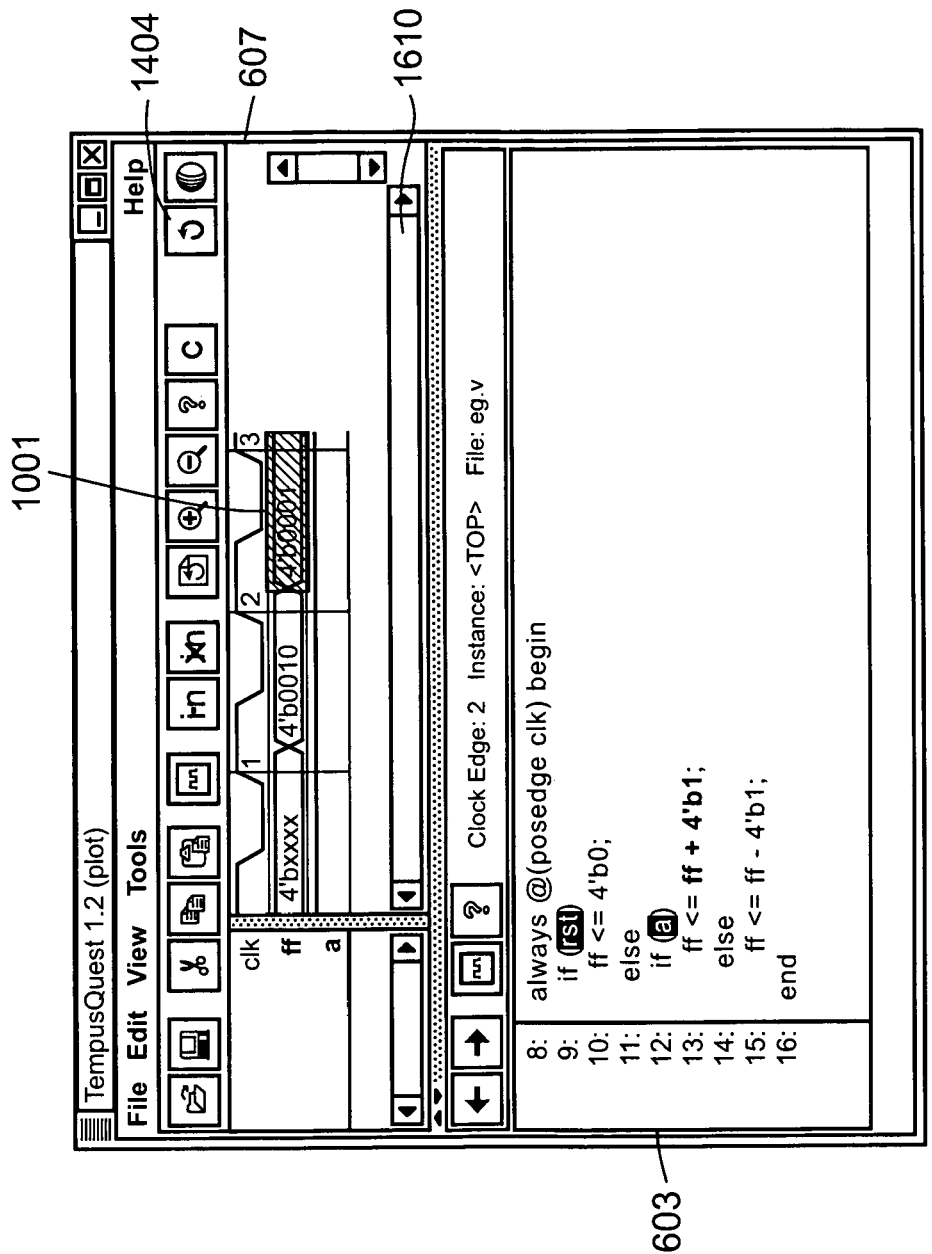
FIG. 16 is a GUI screenshot that provides an example where a user defined rule is modified in case it is not verified in the circuit design.

In many cases, a set of signals is extracted automatically without requiring the user to highlight all relevant signals. The intent here is to assist the user in specifying a rule by automatically refining a rule that cannot be true. For instance, if the rule created by the selection of signal ff at time cycle 3 1001 is verified to be false, System 100 automatically analyzes the circuit design to create a modified rule identical to the one generated by FIG. 15. This is done by analyzing the RTL source code to extract information of the selected signal and signals associated with the selected signal at previous time cycles. For example, consider the screenshot of the example source code as shown in FIG. 16. If the simple rule "ff should not have value 4'b0001" is verified to be false by selecting signal ff at time cycle 3 1001, System 100 creates a modified rule "ff should not have value 4'b0001 if, in the previous clock cycle ff has value 4'b0010 and signal a has value 1". This is done by automatic extraction of information regarding when ff can have the value 4'b0001. Through an analysis of the RTL source code, it is automatically determined that signal ff depends on the previous values of signals rst, a and ff. As signal rst is held as constant 0 after the reset period, it is dropped from the list. As a result, Rule Verifier 104 automatically extracts values of the remaining two signals in the previous cycle, i.e., signal ff at time cycle 2 1506 and signal a 1508.

The user-defined rule is then independently proved for the circuit design. This is done using Rule Verifier 104. Rule Verifier 104 aids the user in proving the defined rule. Rule verifier 104 can use the same approach as Formal Verification tool 110, utilizing analysis region with all the flexibility described in System 100. But System 100 also uses a dedicated formal verification algorithm specifically designed for proving rules.

The rules, whether verified or not, are stored as triples in Database 112. These rules captured in Database 112 are used in many situations for verification.

Rule Verifier 104 uses a subset or entire set of triples stored in Database 112 to prove the user-defined rule. If the rule is proved to be true, the rule is used as an assumption for the current analysis region. The current analysis region is then verified using Formal Verification tool 110 by also adding the assumption based on the user-defined rule.

Productivity Choice Determination Tool 108 uses both verified and unverified rules in Database 112 to determine how the analysis should be modified. A verified rule carries a much stronger recommendation of using it as an assumption instead of expanding the analysis region. An unverified rule leads to an expansion of the analysis region using the articulated fan-in of the related signals.

The procedure followed by System 100 to verify circuit designs is implemented using Java. However, it should be obvious to someone skilled in the art that the procedure can also be implemented using other standard programming languages. Connectivity between different elements of System 100 (as shown in FIG. 1) is provided through local, wide or Internet network infrastructure. Browsing or other data access operations are provided through a browser or functionally equivalent software. In networked configuration, the design browser tools are designed such that various users can access the HDL based designs remotely. Further, network browsers such as Netscape Navigator or Microsoft Internet Explorer can be configured and used such that a browsing workstation is different from the workstation used for maintaining the HDL design database.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for guiding formal verification for a circuit design in circuit simulation software to optimize the time required for verification of the circuit design, the method comprising the steps of:

a. identifying an analysis region for verifying the circuit design;

b. verifying the circuit design by applying formal verification over the analysis region;

c. manually modifying the analysis region if verification of the circuit design over the analysis region results in a determination that the analysis region is not verified including the steps of:

1. selecting a signal in the analysis region; and 2. adding a portion of the circuit design relating to the signal in the analysis region including adding an articulated fan-in driving the signal to the analysis region by identifying the articulated fan-in of the signal by traversing the circuit design backwards from the signal until a signal from the group consisting of primary inputs, storage elements and articulation points is encountered.

2. A method for guiding formal verification for a circuit design in circuit simulation software to optimize the time required for verification of the circuit design, the method comprising the steps of:

a. identifying an analysis region for verifying the circuit design;

b. verifying the circuit design by applying formal verification over the analysis region;

c. manually modifying the analysis region if verification of the circuit design over the analysis region results in a determination that the analysis region is not verified including the steps of:

1. selecting a signal in the analysis region; and 2. adding a portion of the circuit design relating to the signal in the analysis region having the step of adding a portion of an articulated fan-in driving the signal to the analysis region including adding a portion of the articulated fan-in driving the selected signal that is turned-on by current value assignments in a plot window to the analysis region; and repeating steps b–c until the circuit design is verified or until a user identifies an error in the circuit design.

3. A method for guiding formal verification for a circuit design in circuit simulation software to optimize the time required for verification of the circuit design the method comprising the steps of:

a. identifying an analysis region for verifying the circuit design;

b. verifying the circuit design by applying formal verification over the analysis region;

c. manually modifying the analysis region if verification of the circuit design over the analysis region results in a determination that the analysis region is not verified including the steps of:

1. selecting a signal in a plot window; and 2. adding a reset portion of an articulated fan-in of the selected signal in the analysis region; and repeating steps b–c until the circuit design is verified or until a user identifies an error in the circuit design.

4. A method for guiding formal verification for a circuit design in circuit simulation software to optimize the time required for verification of the circuit design, the method comprising the steps of:

a. identifying an analysis region for verifying the circuit design;

b. verifying the circuit design by applying formal verification over the analysis region;

c. manually modifying the analysis region if verification of the circuit design over the analysis region results in a determination that the analysis region is not verified including the steps of:

1. the user selecting an articulation point inside the analysis region; and 2. removing an articulated fan-in of the articulation point from the analysis region or adding an articulated fan-in driving the selected articulation point to the analysis region; and repeating steps b–c until the circuit design is verified or until a user identifies an error in the circuit design.

5. A method for guiding formal verification for a circuit design in circuit simulation software to optimize the time required for verification of the circuit design, the method comprising the steps of:
   a. identifying an analysis region for verifying the circuit design;
   b. verifying the circuit design by applying formal verification over the analysis region;
   c. manually modifying the analysis region if verification of the circuit design over the analysis region results in a determination that the analysis region is not verified including the steps of:
      1. a. the user selecting at least one signal in the analysis region from a plot window, wherein each signal is selected at a specific time cycle;
      2. b. generating a triple based on each selected signal, wherein a triple comprises the name of the selected signal, the specific time cycle of selection and the value of the selected signal at the specific time cycle;
      3. c. generating a rule based on the triples;
      4. d. verifying the rule separately; and
      5. e. verifying the circuit design using the rule as an assumption for the analysis region;

repeating steps b–c until the circuit design is verified or until a user identifies an error in the circuit design.

6. The method according to claim 5, wherein the rule is automatically modified in case the step of verifying of the rule results in non-verification.

7. A method for guiding formal verification for a circuit design in circuit simulation software to optimize time required for verification process, the method comprising the steps of:
   a. identifying an analysis region for verifying the circuit design;
   b. verifying the circuit design by applying formal verification over the analysis region;
   c. identifying candidate signals for modification of the analysis region if verification of the circuit design results in a determination that the circuit design is not verified including the step of identifying articulation points corresponding to the analysis region as the candidate signals;
   d. automatically modifying the analysis region using the candidate signals; and
   e. manually modifying the analysis region if there are no appropriate candidate signals; and repeating steps b–e until the circuit design is verified or until a user identifies an error in the circuit design.

8. The method according to claim 7, wherein the step of identifying articulation points corresponding to the analysis region comprises the steps of:
   a. identifying comparison statements on wide signals as articulation points; and
   b. identifying Boolean guards of conditional statements as articulation points.

9. A method for guiding formal verification for a circuit design in circuit simulation software to optimize time required for verification process the method comprising the steps of:
   a. identifying an analysis region for verifying the circuit design;
   b. verifying the circuit design by applying formal verification over the analysis region;
   c. identifying candidate signals for modification of the analysis region if verification of the circuit design is false results in a determination that the circuit design is not verified;
   d. automatically modifying the analysis region using the candidate signals including the step of prioritizing the candidate signals on the basis of productivity choices; and
   e. manually modifying the analysis region if there are no appropriate candidate signals; and repeating steps b–e until the circuit design is verified or until a user identifies an error in the circuit design.

10. The method according to claim 9, wherein the step of prioritizing candidate signals on the basis of productivity choices comprises the steps of:
    a. assigning productivity weights to analysis region modification choices;
    b. ranking the choices according to productivity weights wherein the choices with positive productivity weights are considered as high-productivity choices and the choices with negative weights are considered low-productivity choices; and
    c. identifying the highest-productivity choices from the high-productivity choices.

11. A method for guiding formal verification for a circuit design in circuit simulation software to optimize time required for verification process, the method comprising the steps of:
    a. identifying an analysis region for verifying the circuit design;
    b. verifying the circuit design by applying formal verification over the analysis region;
    c. identifying candidate signals for modification of the analysis region if verification of the circuit design results in a determination that the circuit design is not verified;
    d. automatically modifying the analysis region using the candidate signals including at least one of the steps of:
       1. expanding the analysis region by including an articulated fan-in corresponding to the highest-productivity choices that are located at the boundary of the analysis region, and
       2. removing the articulated fan-in corresponding to the highest-productivity choices that are located inside the analysis region from the analysis region; and
    e. manually modifying the analysis region if there are no appropriate candidate signals; and repeating steps b–e until the circuit design is verified or until a user identifies an error in the circuit design.

12. The method according to claim 9, wherein the step of automatically modifying the analysis region comprises modifying the analysis region using low-productivity choices on the user's decision in case there are no high-productivity choices.

13. A method for guiding formal verification for a circuit design in circuit simulation software to optimize time required for verification process, the method comprising the steps of:
    a. identifying an analysis region for verifying the circuit design;
    b. verifying the circuit design by applying formal verification over the analysis region;

c. identifying candidate signals for modification of the analysis region if verification of the circuit design results in a determination that the circuit design is not verified;

d. automatically modifying the analysis region using the candidate signals; and e. manually modifying the analysis region if there are no appropriate candidate signals including the steps of:
1. defining an abstraction created in response to the low productivity choices in the analysis region;
2. proving the abstraction in the circuit design separately; and
3. verifying the circuit design using the abstraction in the analysis region; and repeating steps b–e until the circuit design is verified or until a user identifies an error in the circuit design.

14. The method according to claim 13, wherein the step of defining an abstraction comprises adding new logic to the circuit design corresponding to the abstraction.

15. A method for guiding formal verification for a circuit design in circuit simulation software to optimize time required for verification process, the method comprising the steps of:

a. identifying an analysis region for verifying the circuit design;

b. verifying the circuit design by applying formal verification over the analysis region;

c. identifying candidate signals for modification of the analysis region if verification of the circuit design is false results in a determination that the circuit design is not verified;

d. automatically modifying the analysis region using the candidate signals; and e. manually modifying the analysis region if there are no appropriate candidate signals including the steps of:
1. defining an assumption created in response to low productivity choices in the analysis region;
2. proving the assumption in the circuit design separately; and
3. verifying the circuit design using the assumption in the analysis region; and repeating steps b–e until the circuit design is verified or until a user identifies an error in the circuit design.

16. A method for guiding formal verification for a circuit design in circuit simulation software to optimize time required for verification process, the method comprising the steps of:

a. identifying an analysis region for verifying the circuit design;

b. verifying the circuit design by applying formal verification over the analysis region;

c. identifying candidate signals for modification of the analysis region if verification of the circuit design is false results in a determination that the circuit design is not verified;

d. automatically modifying the analysis region using the candidate signals; and e. manually modifying the analysis region if there are no appropriate candidate signals including the steps of:
1. the user selecting at least one signal in the analysis region from a Plot window, wherein each signal is selected at a specific time cycle;
2. generating a triple based on each selected signals, wherein a triple comprises the name of the selected signal, specific time cycle of selection and the value of the selected signal at the specific time cycle; and
3. generating a rule based on the triples;
4. verifying the rule separately; and
5. verifying the circuit design using the rule as an assumption for the analysis region; and repeating steps b–e until the circuit design is verified or until a user identifies an error in the circuit design.

17. The method according to claim 16, wherein the rule is automatically modified in case the step of verifying of the rule results in a determination that the analysis region is not verified.

18. A method for guiding formal verification for a circuit design in circuit simulation software to optimize time required for verification process, the method comprising the steps of:

a. identifying an analysis region for verifying the circuit design;

b. verifying the circuit design by applying formal verification over the analysis region including having a user deciding that there is an error in the circuit design in case there are no high-productivity choices;

c. identifying candidate signals for modification of the analysis region if verification of the circuit design is false results in a determination that the circuit design is not verified;

d. automatically modifying the analysis region using the candidate signals; and e. manually modifying the analysis region if there are no appropriate candidate signals; and repeating steps b–e until the circuit design is verified or until a user identifies an error in the circuit design.

19. A method for guiding formal verification for a circuit design in circuit simulation software to optimize the time required for the verification process, the method comprising the steps of:

a. identifying an analysis region for verifying the circuit design;

b. verifying the circuit design by applying formal verification over the analysis region;

c. identifying articulation points corresponding to the analysis region as analysis region modification choices;

d. automatically modifying the analysis region using an articulated fan-in of the analysis region modification choices if verification of the circuit design over the analysis region results in a determination that the analysis region is not verified;

repeating steps b–d until the circuit design is verified; and repeating steps b–d until a user identifies an error in the circuit design.

20. A system for guiding formal verification of a circuit design in circuit simulation software to optimize time required for verification process, the system comprising:

a. a GUI for enabling a user to input information;

b. an Analysis Region Selection tool for selecting an analysis region for verifying the circuit design;

c. a Formal Verification tool for verifying the circuit design using the selected analysis region and verified user defined rules; and d. a Productivity Choice Determination tool to determine high-productivity choices for expanding the analysis region if verification fails.

21. A system for guiding formal verification of a circuit design in circuit simulation software to optimize time required for verification process, the system comprising:

a. a GUI for enabling a user to input information;

b. an Analysis Region Selection tool for selecting an analysis region for verifying the circuit design;

c. a Formal Verification tool for verifying the circuit design using the selected analysis region and verified user defined rules; and d. an Articulation Point Selection tool to identify articulation points corresponding to the analysis region to choose smaller analysis region for circuit verification.

22. A system for guiding formal verification of a circuit design in circuit simulation software to optimize time required for verification process, the system comprising:

a. a GUI for enabling a user to input information;

b. an Analysis Region Selection tool for selecting an analysis region for verifying the circuit design;

c. a Formal Verification tool for verifying the circuit design using the selected analysis region and verified user defined rules; and d. a Rule Verifier for verifying user defined rules for the analysis region.

23. A system for guiding formal verification of a circuit design in circuit simulation software to optimize time required for verification process, the system comprising:

a. a GUI for enabling a user to input information;

b. an Analysis Region Selection tool for selecting an analysis region for verifying the circuit design;

c. a Formal Verification tool for verifying the circuit design using the selected analysis region and verified user defined rules; and d. a database for storing a set of triples based on a set of signals selected by the user.

24. A system for guiding formal verification of a circuit design in circuit simulation software to optimize time required for verification process, the system comprising:

a. a GUI for enabling a user to input information including a Source Code window for enabling the user to select a signal from a source code displayed;

b. an Analysis Region Selection tool for selecting an analysis region for verifying the circuit design;

c. a Formal Verification tool for verifying the circuit design using the selected analysis region and the verified user defined rules.

25. A system for guiding formal verification of a circuit design in circuit simulation software to optimize time required for verification process, the system comprising:

a. a GUI for enabling a user to input information including a Plot window for enabling the user to select a signal at a specific time cycle from the waveform of the signal displayed to the user;

b. an Analysis Region Selection tool for selecting an analysis region for verifying the circuit design;

c. a Formal Verification tool for verifying the circuit design using the selected analysis region and the verified user defined rules.

26. A system for guiding formal verification of a circuit design in circuit simulation software to optimize time required for verification process, the system comprising:

a. a GUI for enabling a user to input information;

b. an Analysis Region Selection tool for selecting an analysis region for verifying the circuit design;

c. a Formal Verification tool for verifying the circuit design using the selected analysis region and verified user defined rules;

d. a Productivity Choice Determination tool to determine high-productivity choices for expanding the analysis region if verification fails;

e. an Articulation Point Selection tool to identify articulation points corresponding to the analysis region to choose smaller analysis region for circuit verification;

f. a Rule Verifier for verifying user defined rules for the analysis region; and g. a database for storing a set of triples based on a set of signals selected by the user.

* * * * *

UNITED STATES PATENT AND TRADEMARK OFFICE
CERTIFICATE OF CORRECTION

PATENT NO. : 7,065,726 B1
APPLICATION NO. : 10/606419
DATED : June 20, 2006
INVENTOR(S) : Vigyan Singhal et al.

It is certified that error appears in the above-identified patent and that said Letters Patent is hereby corrected as shown below:

Column 18, line 4, please delete the word "is" at the end of the line;
Column 18, line 5, please delete the word "false" at the beginning of the line;
Column 19, line 29, please delete the word "is" at the end of the line;
Column 19, line 30, please delete the word "false" at the beginning of the line;
Column 19, line 53, please delete the word "is" at the end of the line;
Column 19, line 54, please delete the word "false" at the beginning of the line;
Column 20, line 21, please delete the word "is" at the end of the line; and
Column 20, line 22, please delete the word "false" at the beginning of the line;

Signed and Sealed this

Tenth Day of October, 2006

JON W. DUDAS
*Director of the United States Patent and Trademark Office*